(12) United States Patent
Aoyagi et al.

(10) Patent No.: US 10,510,286 B2
(45) Date of Patent: Dec. 17, 2019

(54) MOUNTING SUBSTRATE AND ELECTRONIC APPARATUS

(71) Applicant: Sony Corporation, Tokyo (JP)

(72) Inventors: Akiyoshi Aoyagi, Kanagawa (JP); Ken Kikuchi, Tokyo (JP); Katsuhiro Tomoda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 189 days.

(21) Appl. No.: 15/128,438

(22) PCT Filed: Mar. 17, 2015

(86) PCT No.: PCT/JP2015/057849
§ 371 (c)(1),
(2) Date: Sep. 23, 2016

(87) PCT Pub. No.: WO2015/151798
PCT Pub. Date: Oct. 8, 2015

(65) Prior Publication Data
US 2018/0218668 A1    Aug. 2, 2018

(30) Foreign Application Priority Data
Mar. 31, 2014    (JP) .................. 2014-074842

(51) Int. Cl.
G09G 3/32        (2016.01)
G09G 3/20        (2006.01)
H01L 27/32       (2006.01)

(52) U.S. Cl.
CPC .......... *G09G 3/32* (2013.01); *G09G 3/2085* (2013.01); *G09G 3/2088* (2013.01);
(Continued)

(58) Field of Classification Search
CPC ............ G09G 3/32; G09G 2300/0408; G09G 2300/0426; G09G 2310/0294;
(Continued)

(56) References Cited

U.S. PATENT DOCUMENTS 5,812,105 A    9/1998  Van de Ven
6,184,853 B1 * 2/2001  Hebiguchi ........... G09G 3/3607
                                                         345/589

(Continued)

FOREIGN PATENT DOCUMENTS

JP    2001-215528 A    8/2001
JP    2003-115613 A    4/2003
(Continued)

OTHER PUBLICATIONS

U.S. Appl. No. 15/128,227, filed Sep. 22, 2016, Aoyagi et al.
U.S. Appl. No. 15/128,443, filed Sep. 23, 2016, Aoyagi.

*Primary Examiner* — Antonio Xavier
(74) *Attorney, Agent, or Firm* — Wolf, Greenfield & Sacks, P.C.

(57) ABSTRACT

There is provided a mounting substrate that makes a seam more inconspicuous when a plurality of mounting substrates are tiled, and an electronic apparatus including the mounting substrate.
The mounting substrate includes a wiring substrate, a plurality of pixels (11) arranged in a matrix in a pixel region of the wiring substrate, and a plurality of drivers (14A) that are disposed in the pixel region and select the pixels in units of two or more pixels. Each of the pixels includes an optical element that emits or receives light, and a pixel circuit that controls light emission or light reception of the optical element. One or more of the plurality of drivers are assigned to each pixel row or every plurality of pixel rows.

9 Claims, 19 Drawing Sheets

(52) U.S. Cl.
CPC ............... *G09G 2300/026* (2013.01); *G09G 2300/0408* (2013.01); *G09G 2300/0426* (2013.01); *G09G 2310/0294* (2013.01); *G09G 2310/08* (2013.01); *G09G 2360/142* (2013.01); *H01L 27/3293* (2013.01)

(58) Field of Classification Search
CPC ......... G09G 2310/08; G09G 2360/142; G09G 3/2085; G09G 3/2088; H01L 27/3293
See application file for complete search history.

(56) References Cited

U.S. PATENT DOCUMENTS

| | | | | |
|---|---|---|---|---|
| 6,501,441 | B1* | 12/2002 | Ludtke | G06F 3/1446 345/1.1 |
| 7,250,978 | B2* | 7/2007 | Lee | H04N 9/12 348/383 |
| 2004/0032220 | A1* | 2/2004 | Cok | H01L 27/3204 315/291 |
| 2005/0017268 | A1* | 1/2005 | Tsukamoto | G09F 9/30 257/200 |
| 2006/0061535 | A1* | 3/2006 | Kim | G09G 3/3677 345/98 |
| 2006/0158393 | A1* | 7/2006 | Fukumoto | G09G 3/3275 345/76 |
| 2008/0129363 | A1* | 6/2008 | Usui | H03K 19/0175 327/306 |
| 2008/0174515 | A1 | 7/2008 | Matthies et al. | |
| 2008/0211760 | A1* | 9/2008 | Baek | G09G 3/3677 345/98 |
| 2008/0308797 | A1* | 12/2008 | Akimoto | H01L 27/1225 257/43 |
| 2009/0033644 | A1 | 2/2009 | Kawaguchi et al. | |
| 2009/0179891 | A1 | 7/2009 | Kim | |
| 2010/0156771 | A1* | 6/2010 | Lee | G02F 1/136286 345/87 |
| 2010/0177089 | A1* | 7/2010 | Huang | G09G 3/3677 345/214 |
| 2010/0207851 | A1* | 8/2010 | Cok | G09G 3/3208 345/82 |
| 2010/0253677 | A1* | 10/2010 | Kroll | G02B 26/0875 345/419 |
| 2011/0057861 | A1* | 3/2011 | Cok | H01L 27/3293 345/1.3 |
| 2011/0102309 | A1* | 5/2011 | Cho | G09G 3/3648 345/92 |
| 2012/0256814 | A1* | 10/2012 | Ootorii | G09G 3/3208 345/82 |
| 2013/0009938 | A1* | 1/2013 | Hwang | G09G 3/348 345/212 |
| 2014/0001502 | A1 | 1/2014 | Akimoto et al. | |
| 2014/0117314 | A1* | 5/2014 | Jeong | C07K 14/245 257/40 |
| 2014/0159798 | A1* | 6/2014 | Duan | G09G 3/3611 327/434 |
| 2014/0168037 | A1* | 6/2014 | Sakariya | G09G 3/3233 345/82 |
| 2015/0131017 | A1* | 5/2015 | Ro | G02F 1/133345 349/42 |
| 2015/0161930 | A1* | 6/2015 | Kim | G09G 3/20 345/214 |
| 2015/0169011 | A1* | 6/2015 | Bibl | G06F 3/0412 345/175 |
| 2015/0243220 | A1* | 8/2015 | Kim | H01L 27/1225 345/215 |
| 2015/0277180 | A1* | 10/2015 | Seo | G02F 1/13306 349/58 |
| 2016/0267836 | A1* | 9/2016 | Meersman | G09G 3/32 |
| 2017/0103926 | A1 | 4/2017 | Aoyagi et al. | |
| 2018/0174973 | A1 | 6/2018 | Aoyagi | |

FOREIGN PATENT DOCUMENTS

| | | |
|---|---|---|
| JP | 2005-033141 A | 2/2005 |
| JP | 2006-179942 A | 7/2006 |
| JP | 2006-251534 A | 9/2006 |
| JP | 2007-188079 A | 7/2007 |
| JP | 2009-037164 A | 2/2009 |
| JP | 2010-015163 A | 1/2010 |
| JP | 2010-238323 A | 10/2010 |
| JP | 2012-042567 A | 3/2012 |
| JP | 2012-142376 A | 7/2012 |
| JP | 2012-518208 A | 8/2012 |
| JP | 2012-227514 A | 11/2012 |
| JP | 2014-011275 A | 1/2014 |
| WO | WO 2013/105347 A1 | 7/2013 |

* cited by examiner

[FIG. 1]
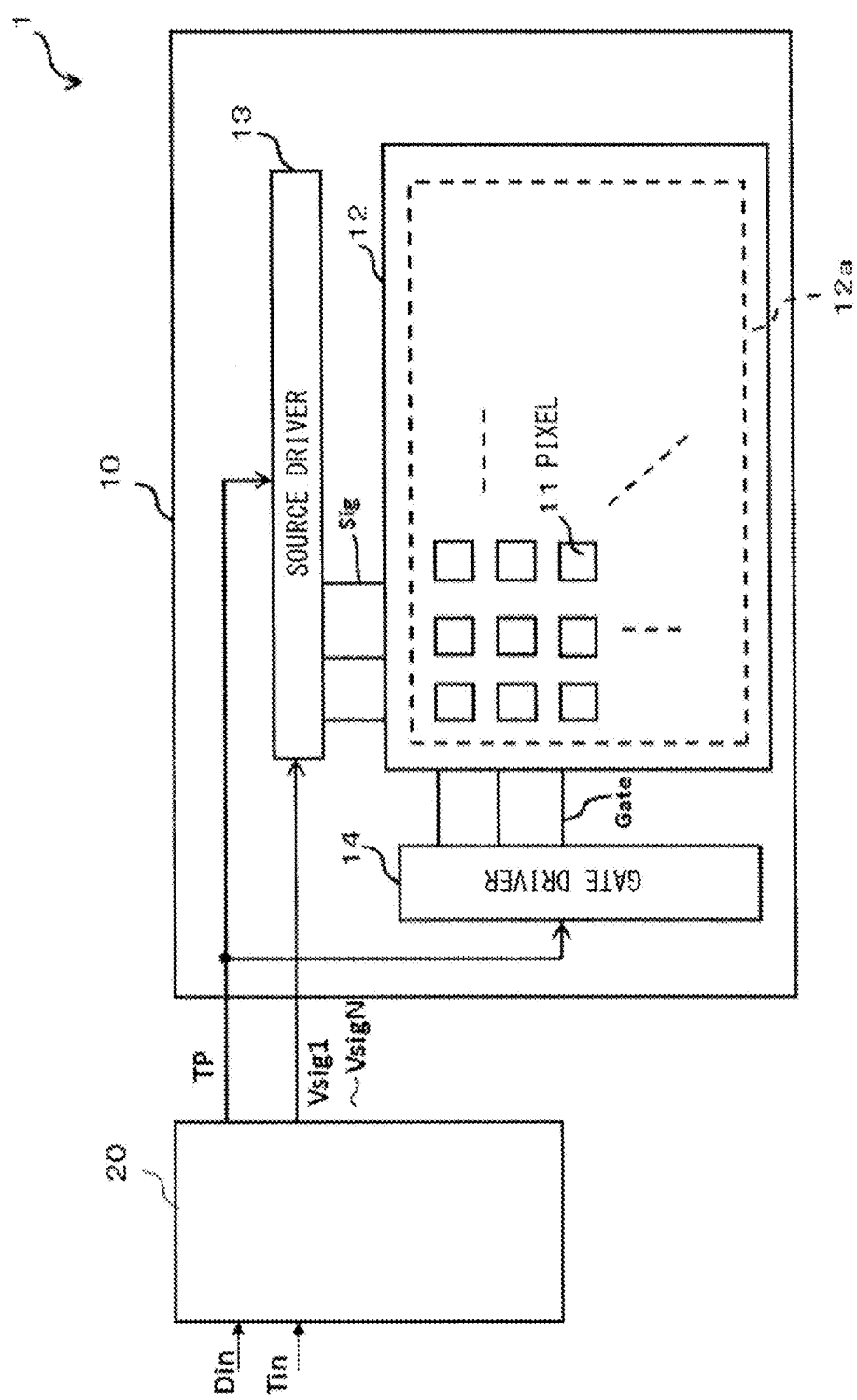

[FIG. 2]
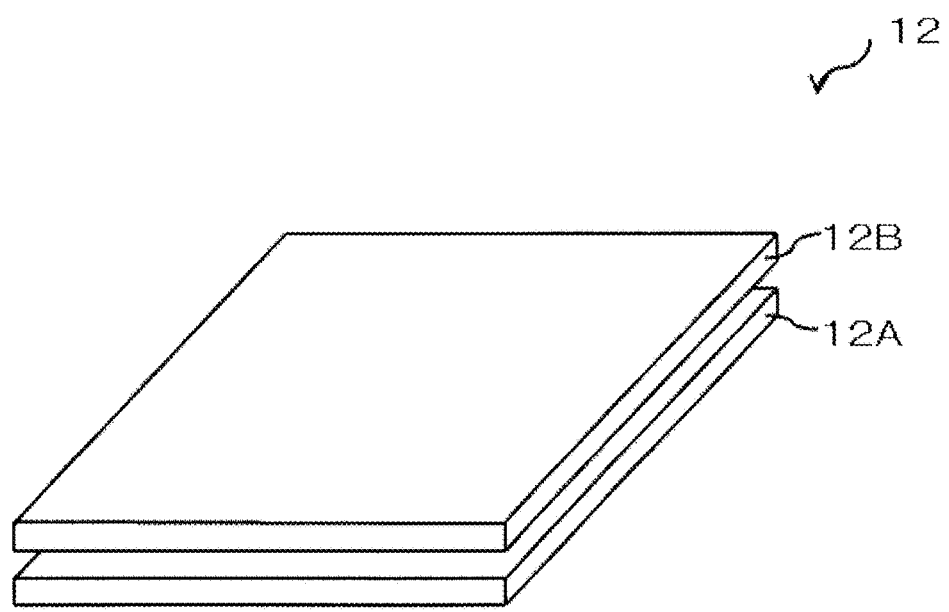

[ FIG. 3 ]
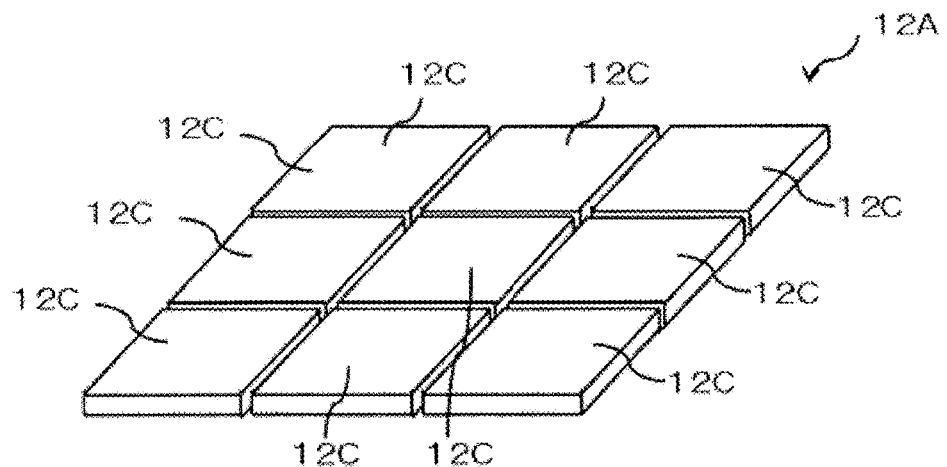
[ FIG. 4 ]
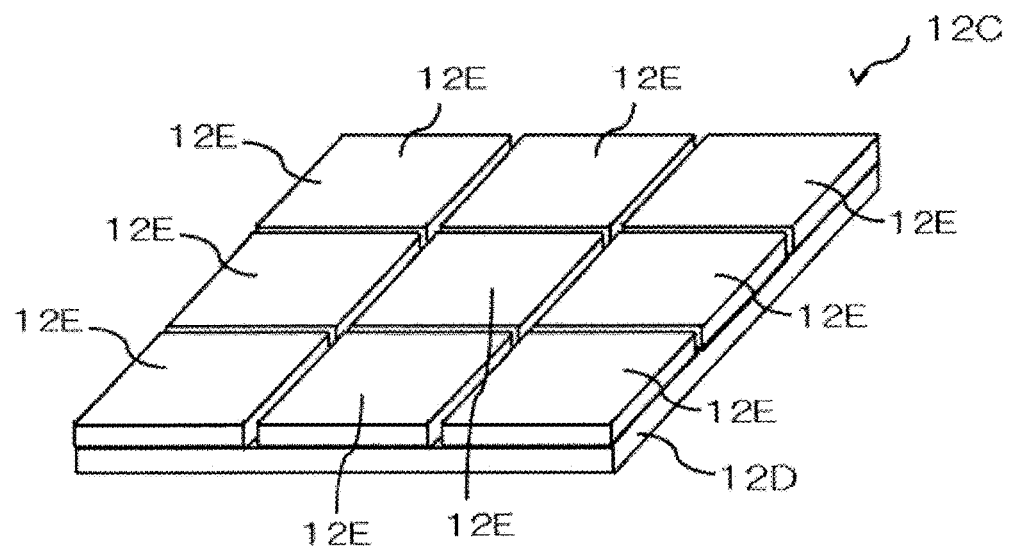

[FIG. 5]
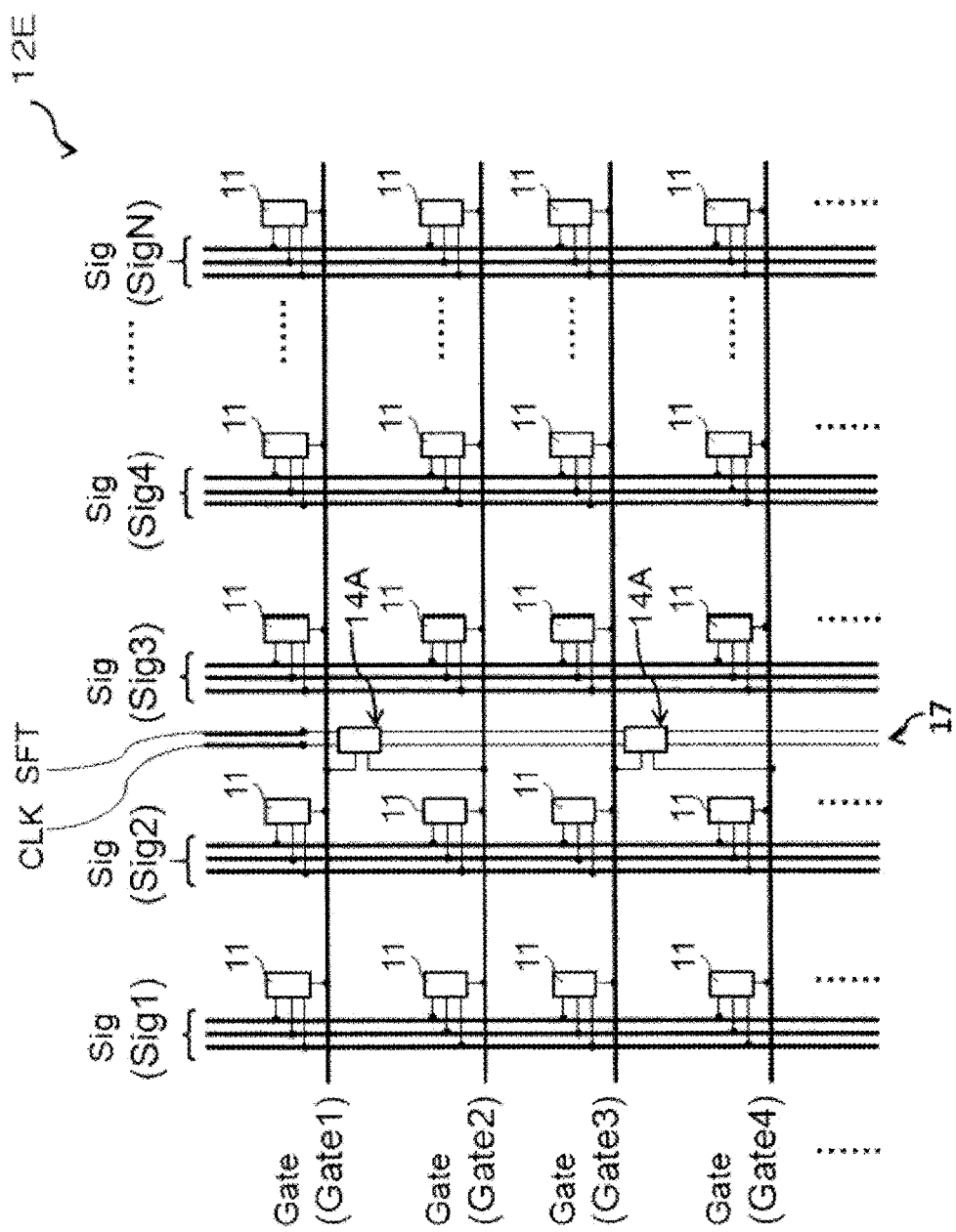

[FIG. 6]
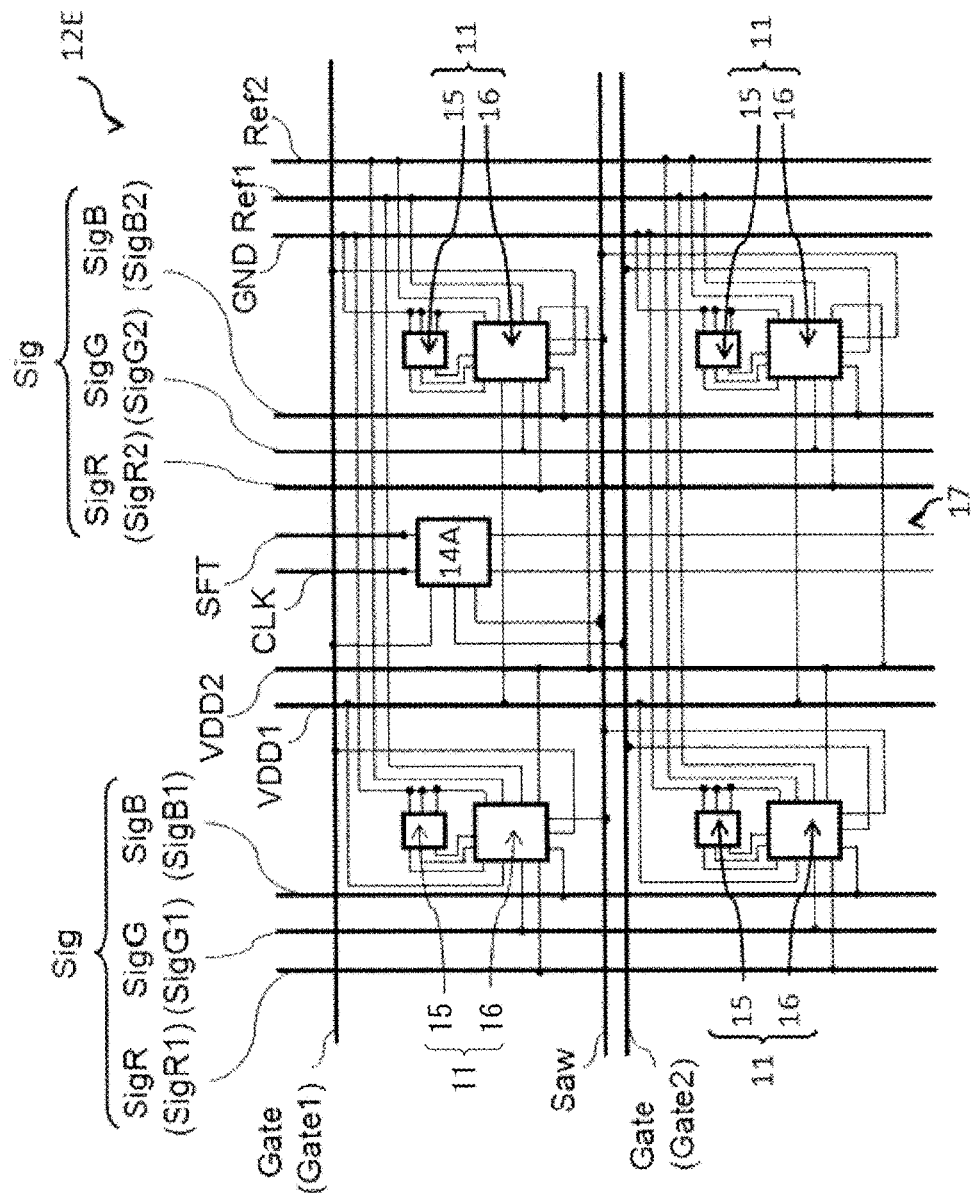

[FIG. 7]
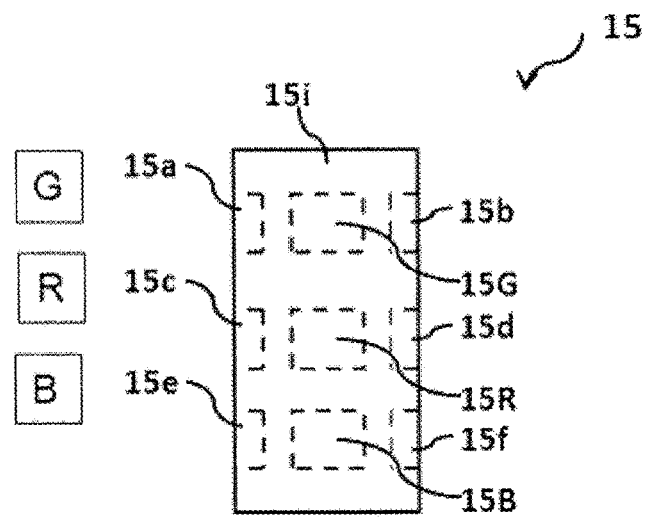
[FIG. 8]
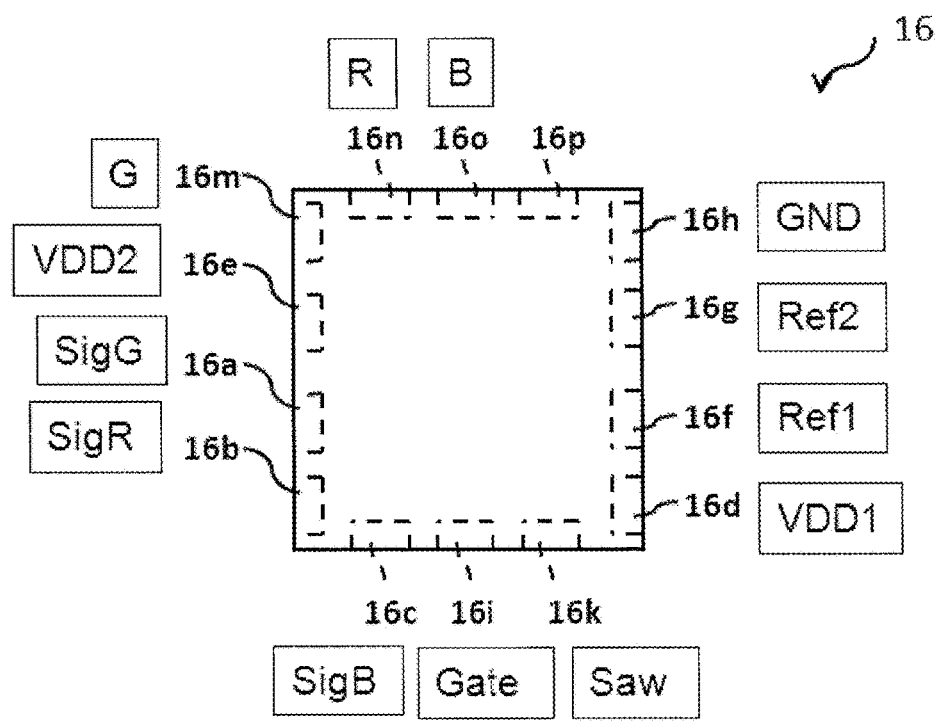

[FIG. 9]
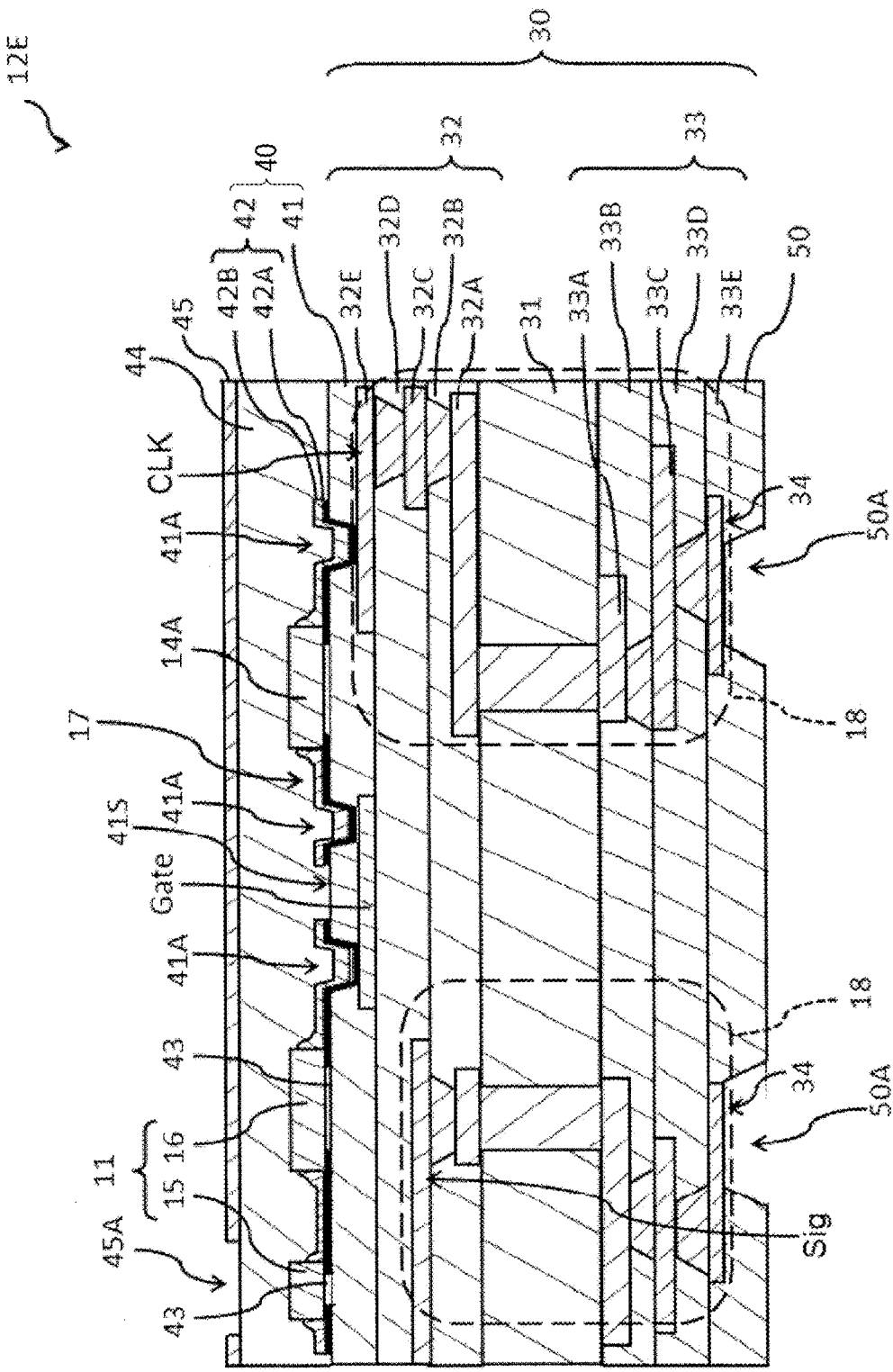

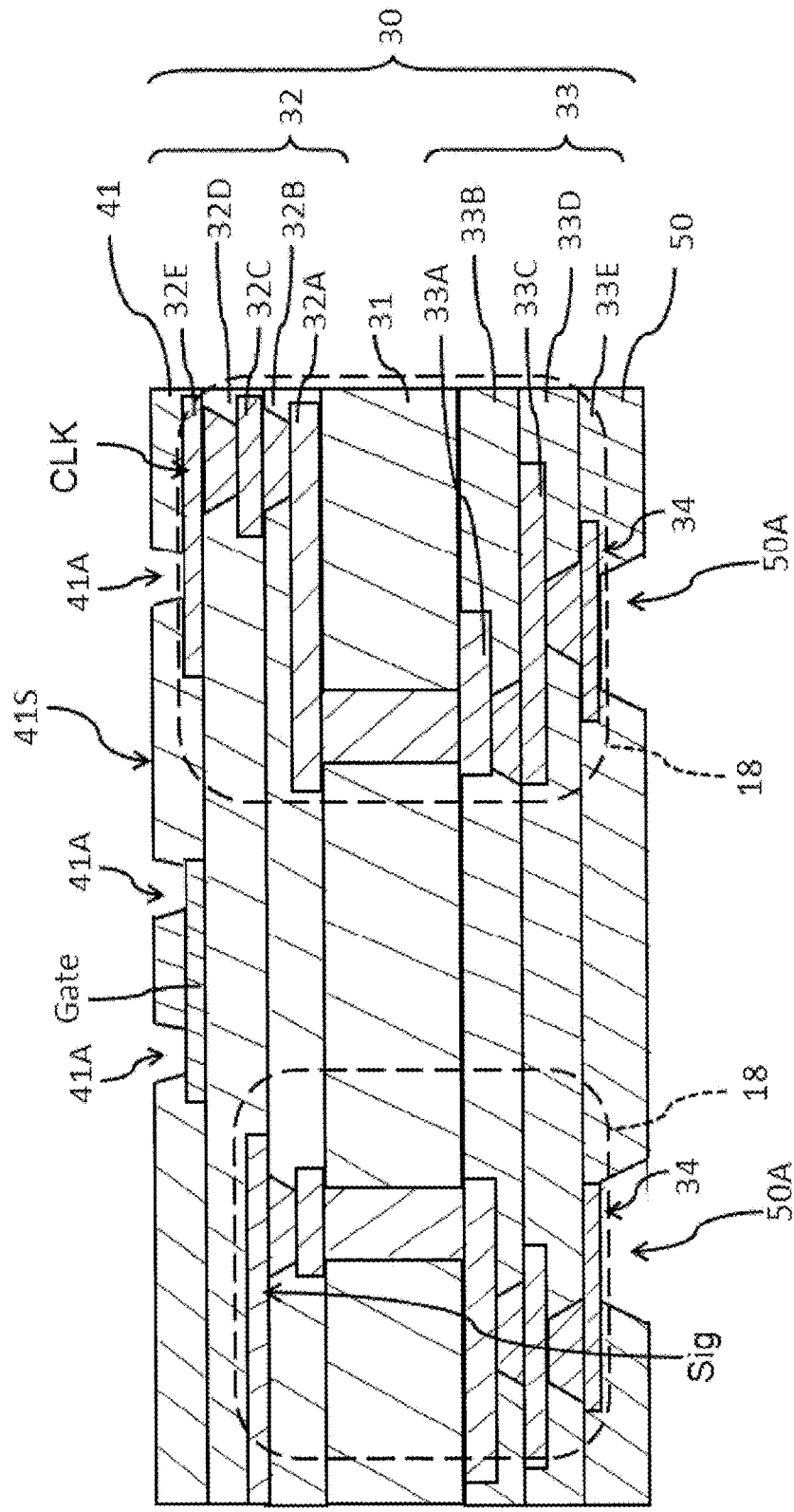
[FIG. 10]

[ FIG. 11 ]
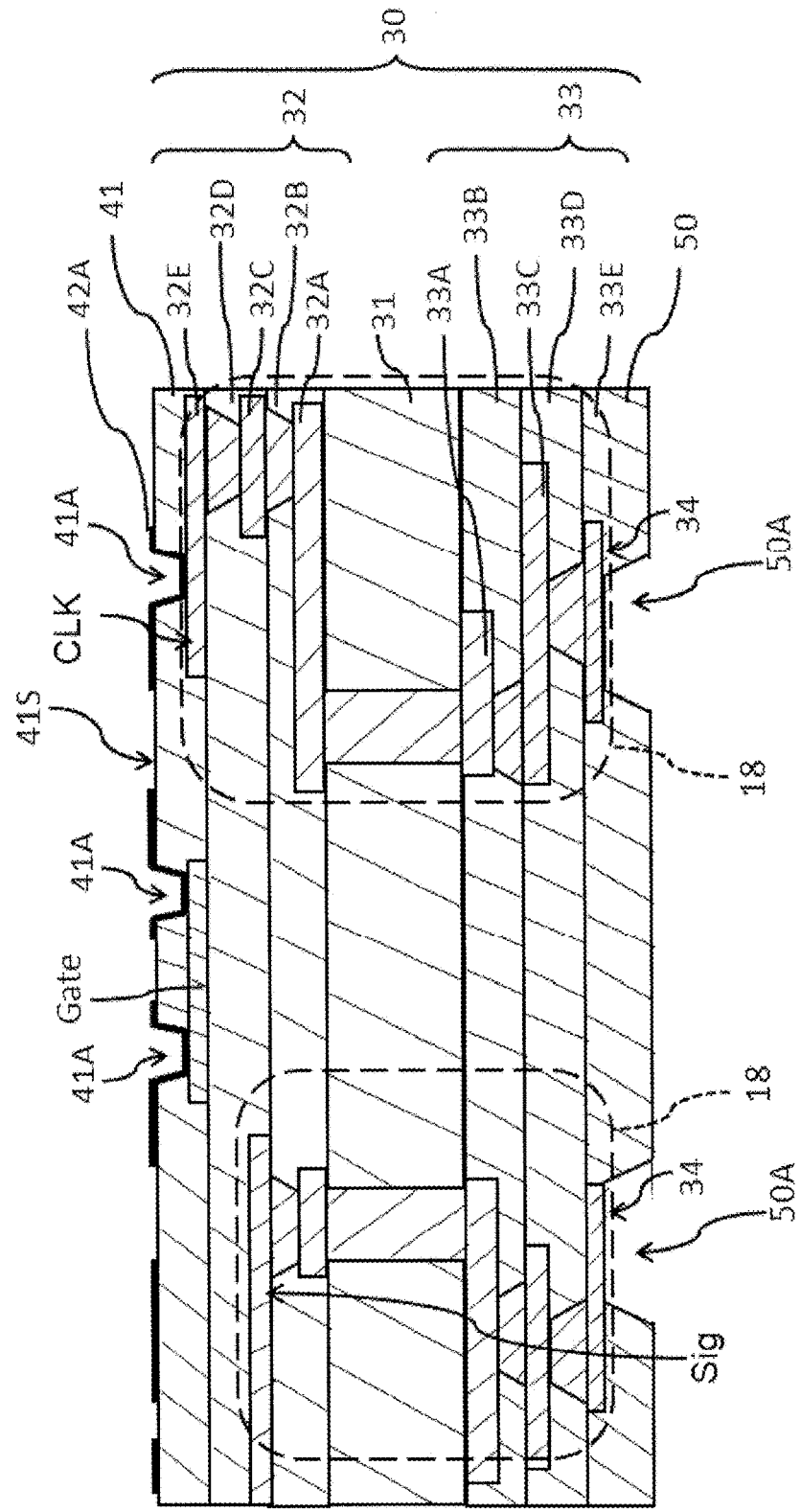

[ FIG. 12 ]
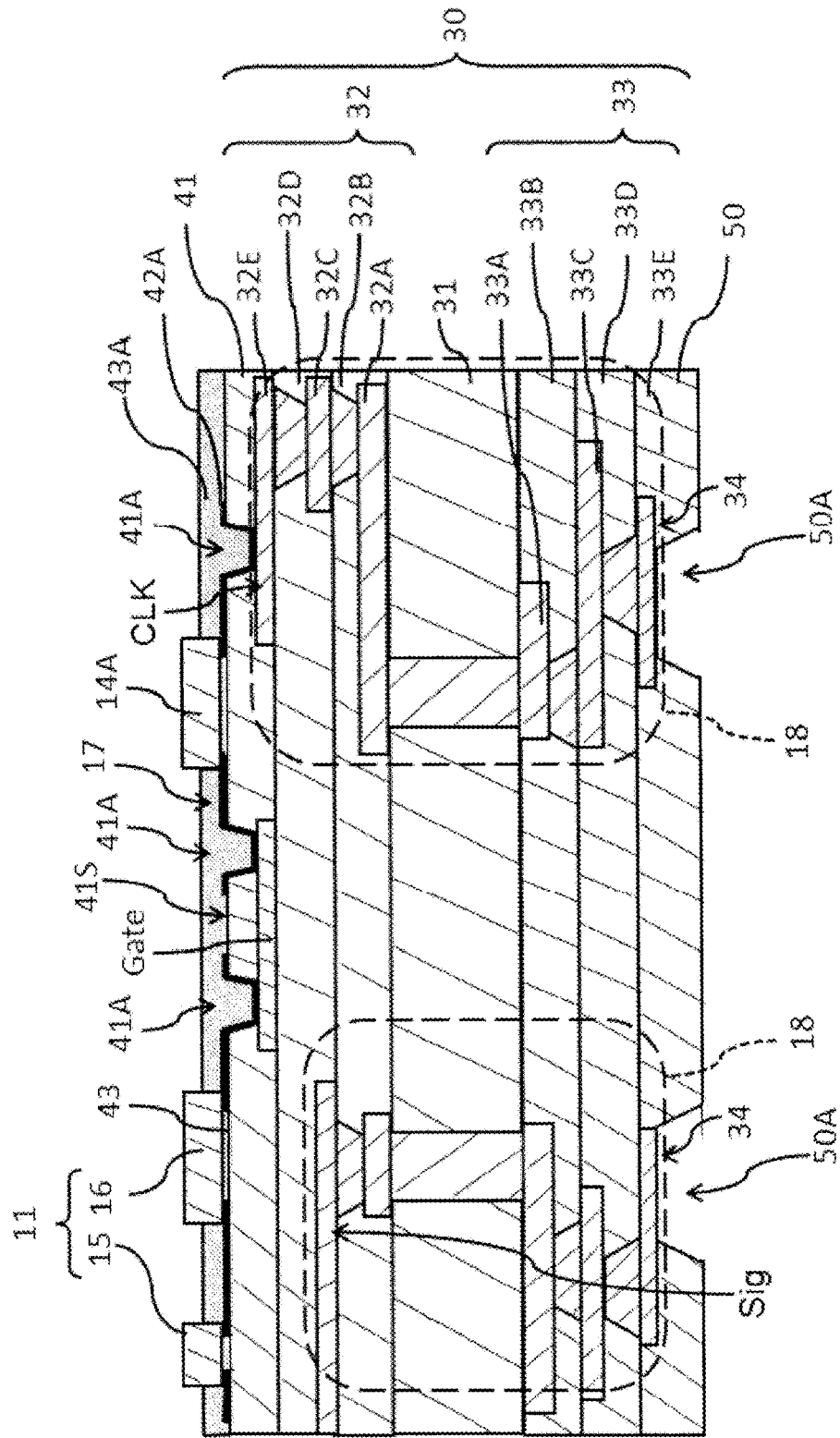

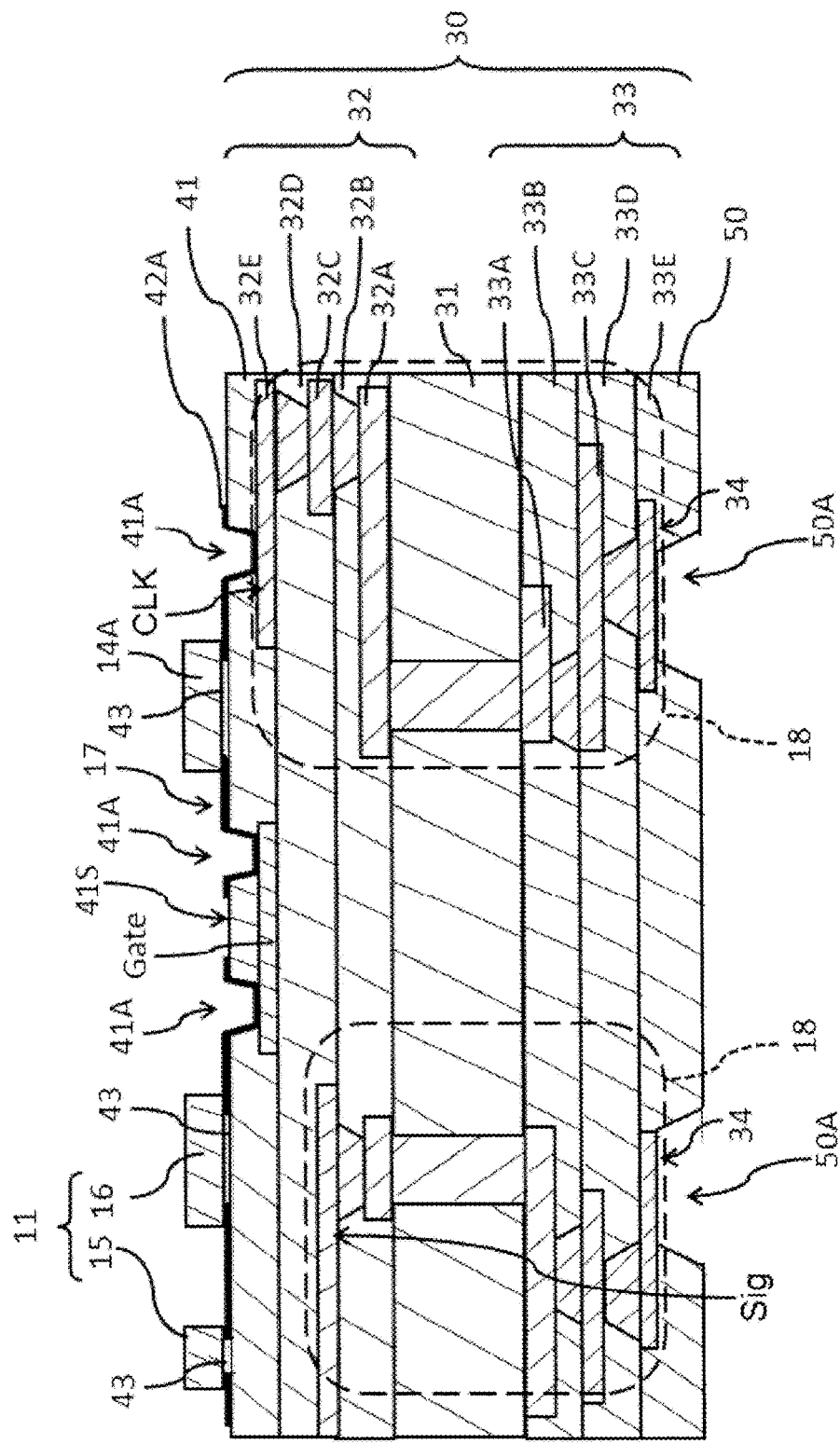
[ FIG. 13 ]

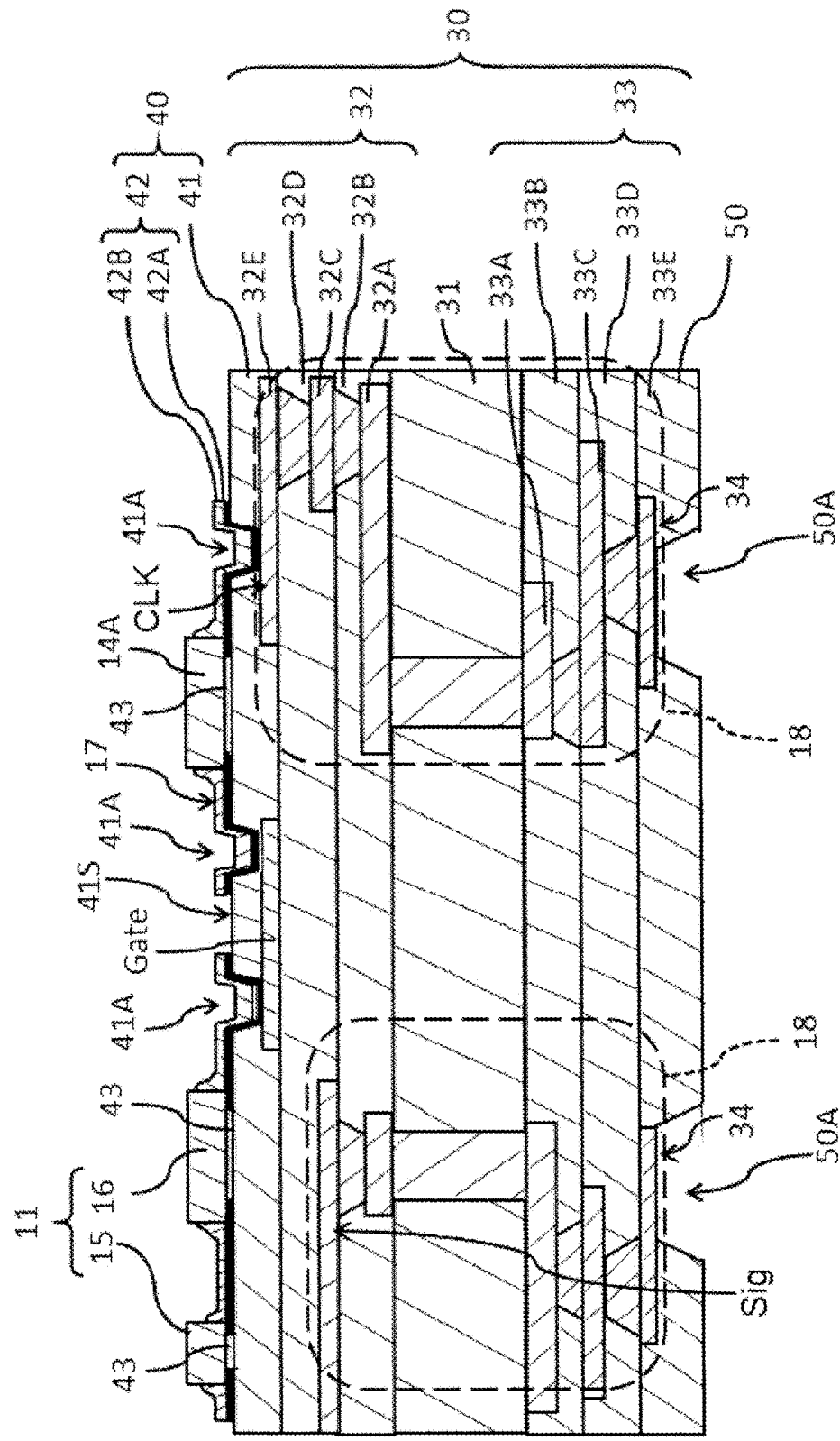
[ FIG. 14 ]

[ FIG. 15 ]
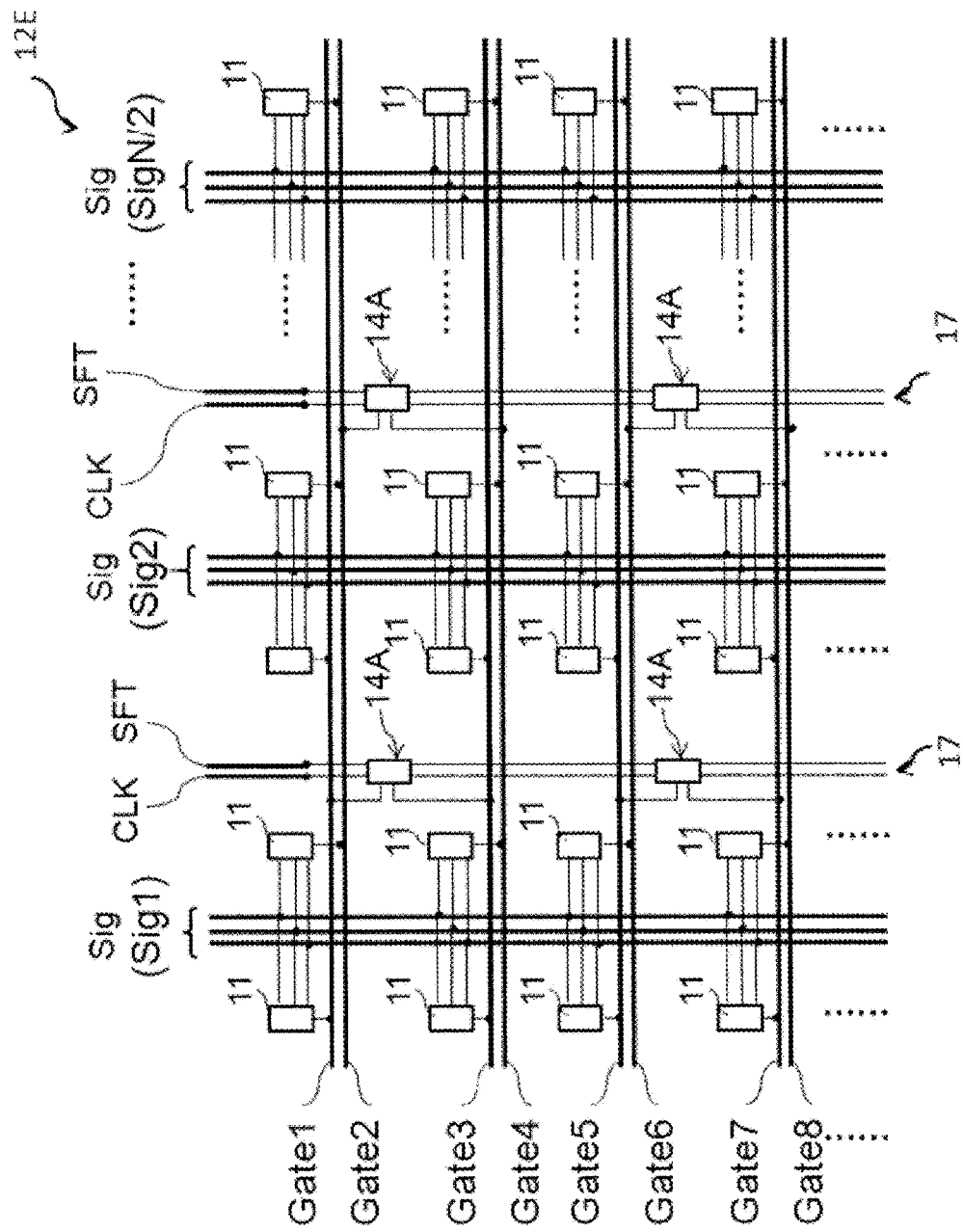

[FIG. 16]
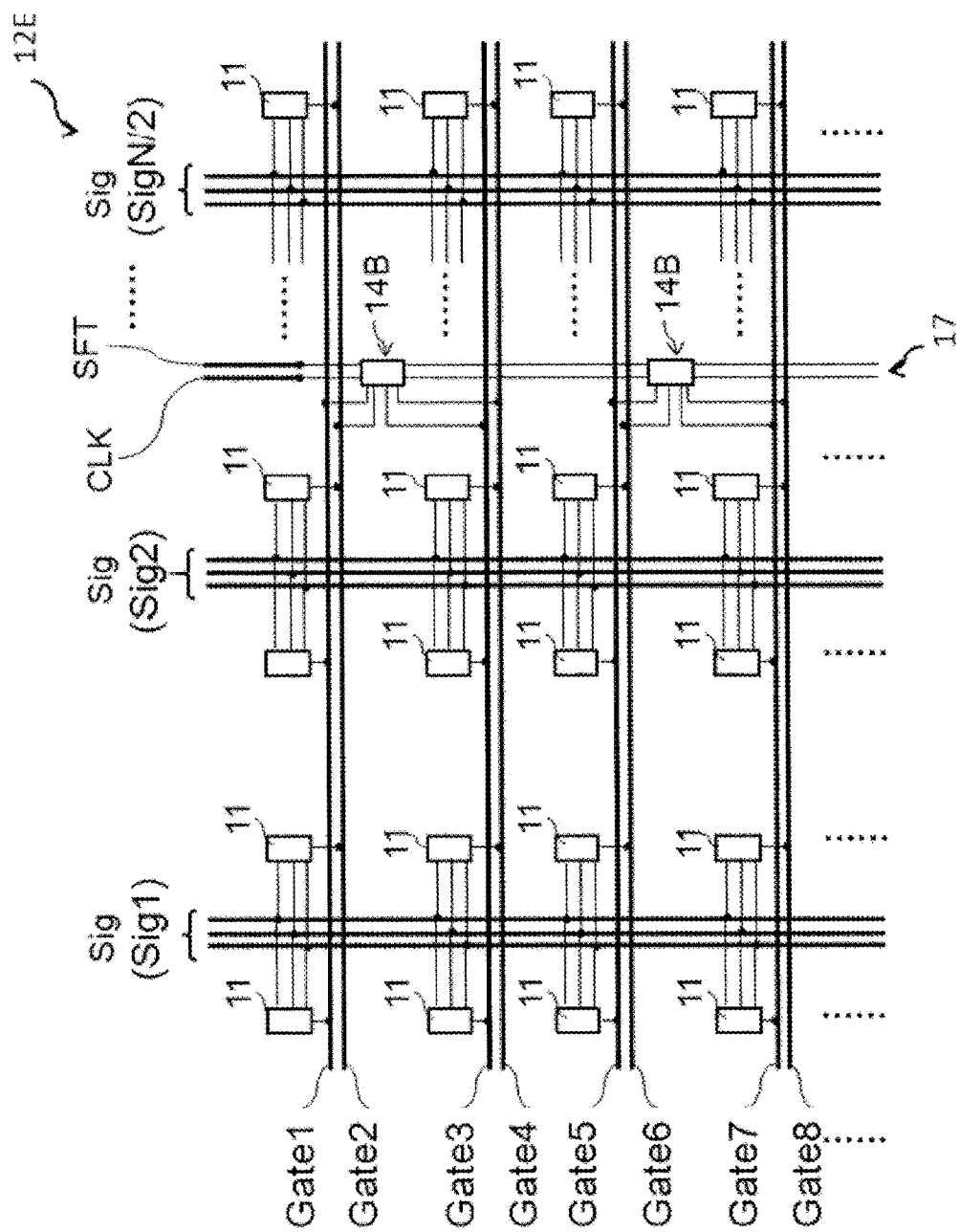

[ FIG. 17 ]
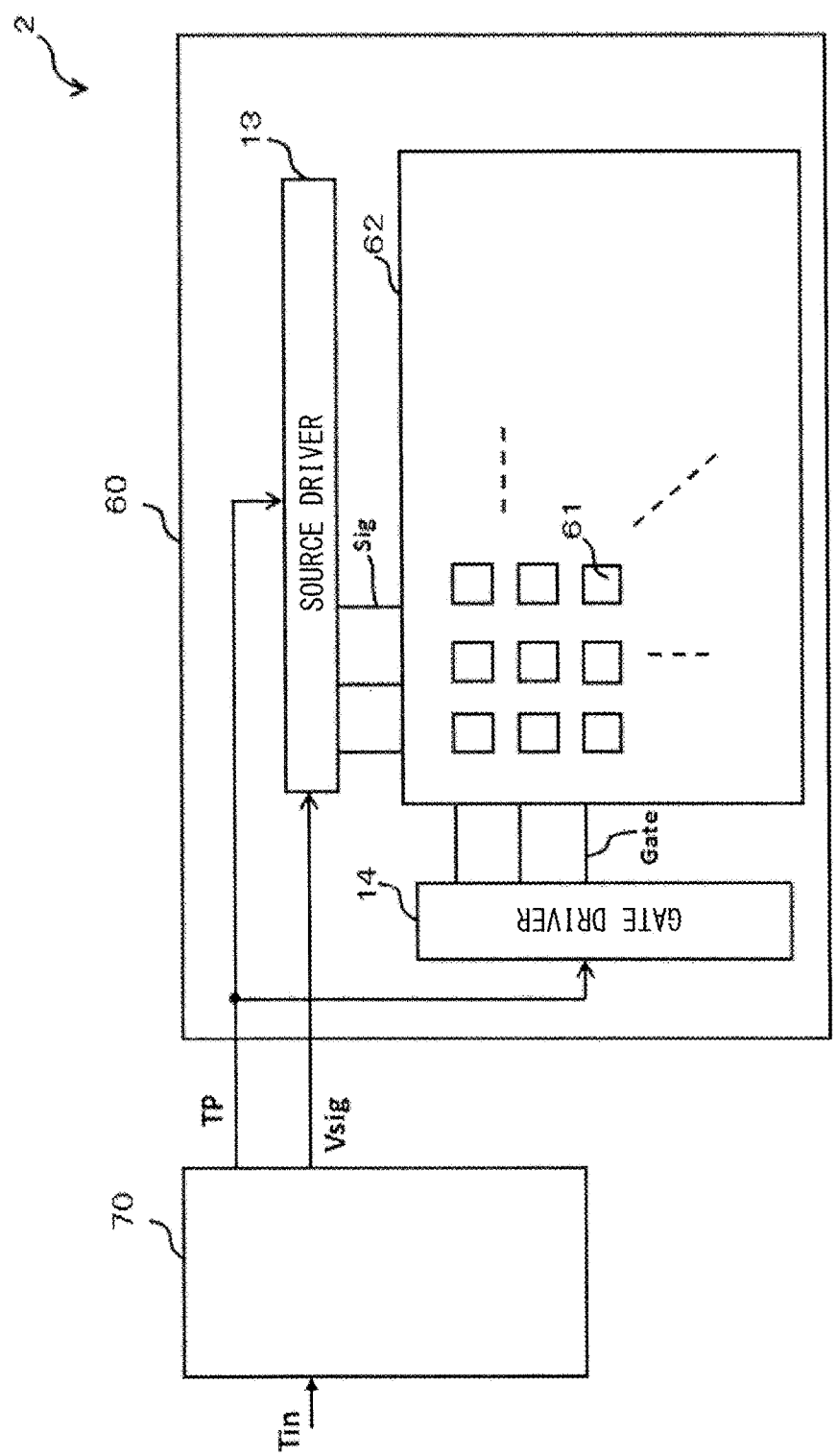

[ FIG. 18 ]
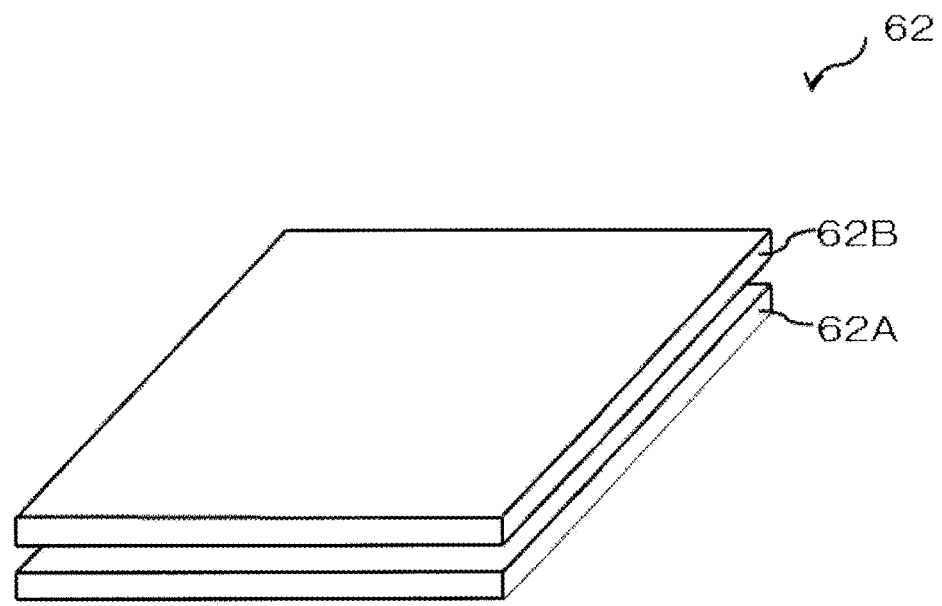

[ FIG. 19 ]
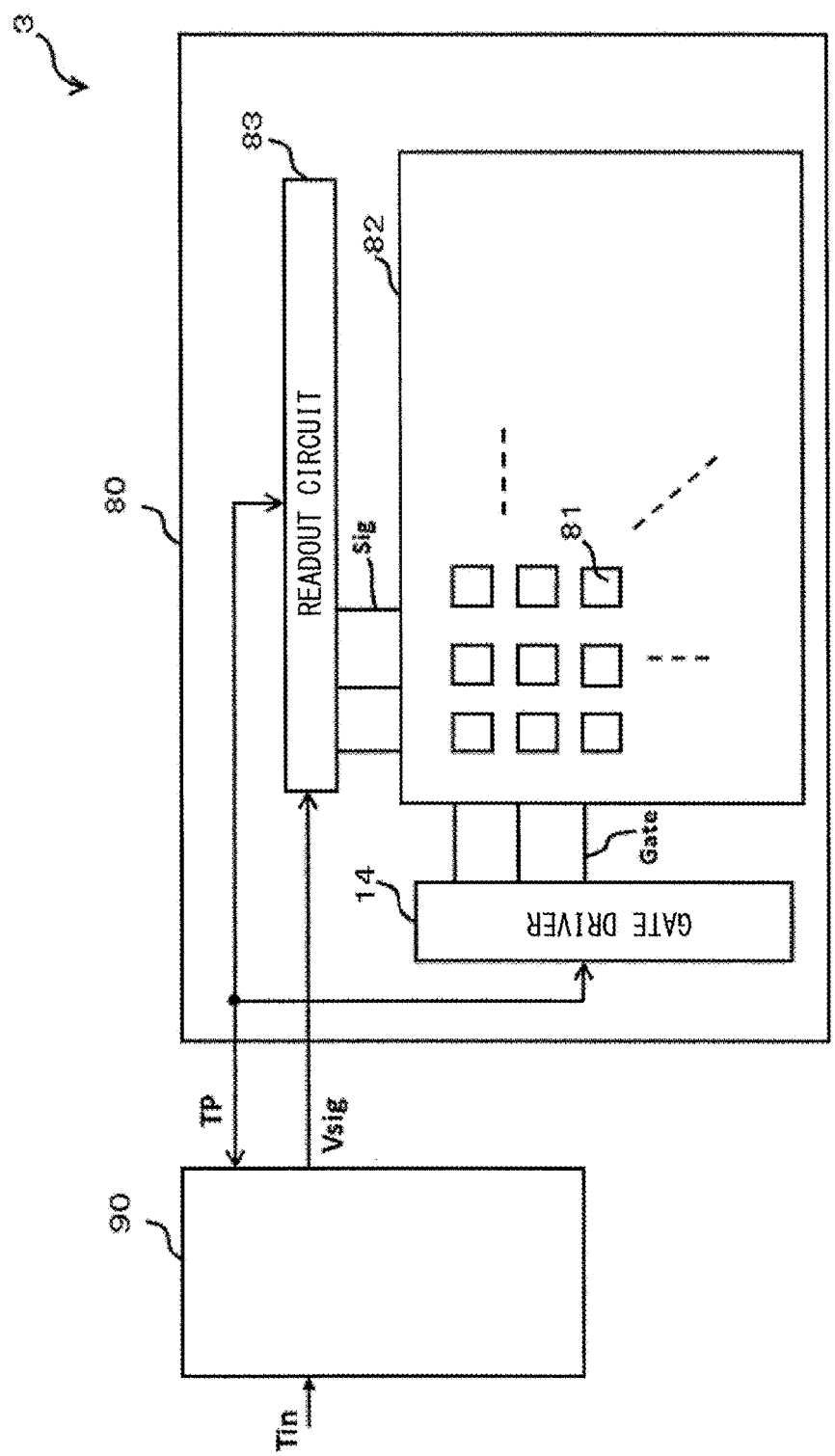

[ FIG. 20 ]
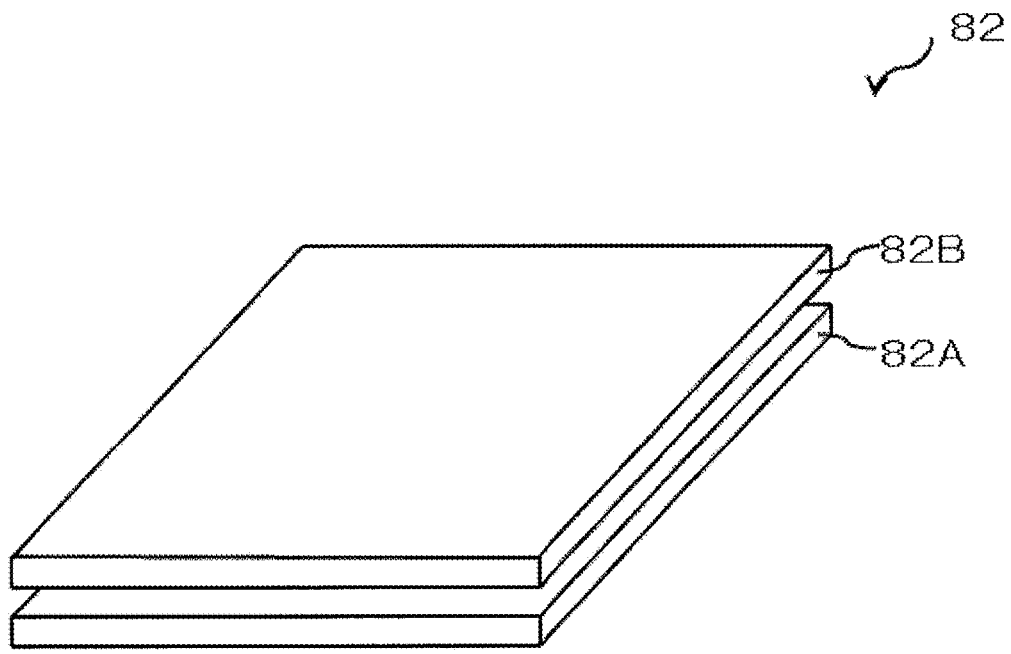
[ FIG. 21 ]
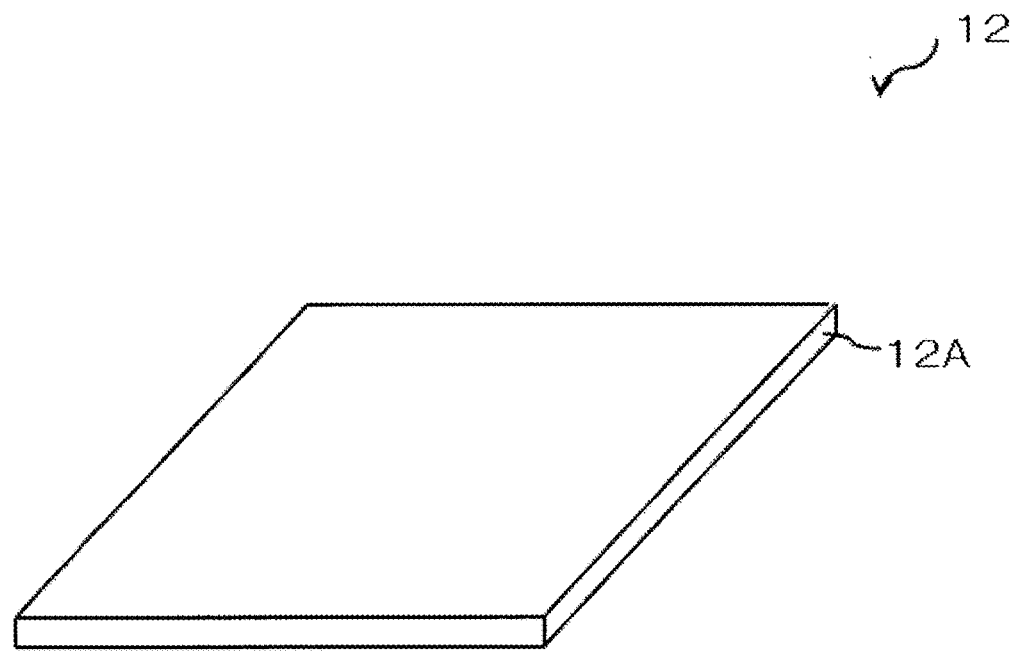

[ FIG. 22 ]
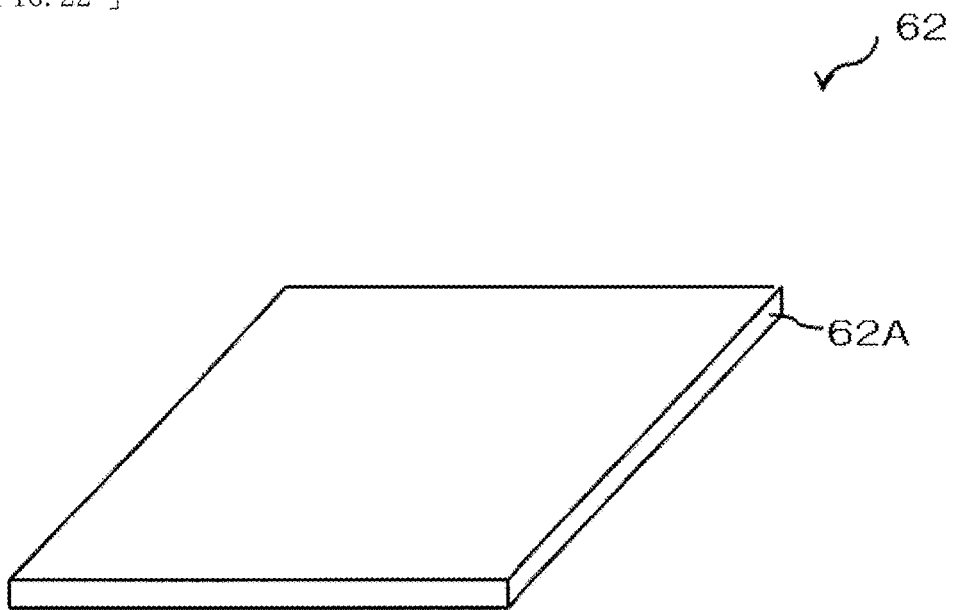
[ FIG. 23 ]
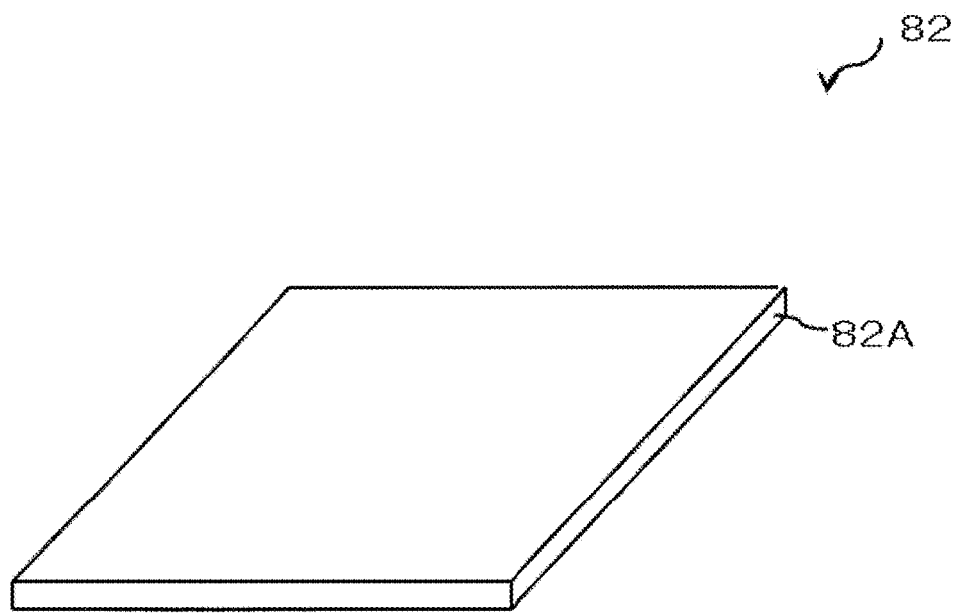

MOUNTING SUBSTRATE AND ELECTRONIC APPARATUS

CROSS-REFERENCE TO RELATED APPLICATIONS

This application is a National Stage of International Application No. PCT/JP2015/057849, filed in the Japanese Patent Office as a Receiving office on Mar. 17, 2015, which claims priority to Japanese Patent Application Number 2014-074842, filed in the Japanese Patent Office on Mar. 31, 2014, each of which is hereby incorporated by reference in its entirety.

TECHNICAL FIELD

The present technology relates to a mounting substrate including a driver on a wiring substrate and an electronic apparatus including the mounting substrate.

BACKGROUND ART

COG (Chip On Glass) and COF (Chip On Film) are known as techniques of mounting a driver that selects a display pixel (refer to Patent Literatures 1 and 2, for example).

CITATION LIST

Patent Literature

Patent Literature 1: Japanese Unexamined Patent Application Publication No. 2007-188079
Patent Literature 2: Japanese Unexamined Patent Application Publication No. 2012-042567

SUMMARY

When COG is used, it is necessary to provide space for mounting of a connection terminal of an FPC on a top surface end of a mounting substrate. When COF is used, it is necessary to provide space for mounting of a driver on a top surface end of a mounting substrate. This means that in either of the techniques, space is necessary on the top surface end of the mounting substrate. Accordingly, it is necessary to provide a frame region in which display pixels are not allowed to be disposed. However, providing such a frame region causes an issue that when a plurality of mounting substrates are tiled, a seam is clearly visible in a displayed image.

Note that such an issue may occur not only in the field of display units but also in the field of illumination units and light receivers.

It is therefore desirable to provide a mounting substrate that makes a seam more inconspicuous when a plurality of mounting substrates are tiled, and an electronic apparatus including the mounting substrate.

A mounting substrate according to an embodiment of the present technology includes: a wiring substrate; a plurality of pixels arranged in a matrix in a pixel region of the wiring substrate; and a plurality of drivers that are disposed in the pixel region and select the plurality of pixels in units of two or more pixels. Each of the pixels includes an optical element and a pixel circuit. The optical element emits or receives light. The pixel circuit controls light emission or light reception of the optical element. One or more of the plurality of drivers are assigned to each pixel row or every plurality of pixel rows.

An electronic apparatus according to an embodiment of the present technology includes one or more mounting substrates mentioned above, and a control circuit that controls the one or more mounting substrates.

In the mounting substrate and the electronic apparatus according to the embodiments of the present technology, the plurality of drivers are disposed in the pixel region, and one or more of the drivers are assigned to each pixel row or every plurality of pixel rows. Accordingly, it is not necessary to provide the plurality of drivers on a top surface end of the mounting substrate, and it is not necessary to provide a connection terminal of an FPC including the plurality of drivers on the top surface end of the mounting substrate.

According to the mounting substrate and the electronic apparatus according to the embodiments of the present technology, the plurality of drivers are disposed in the pixel region, and one or more of the drivers are assigned to each pixel row or every plurality of pixel rows, which makes a seam more inconspicuous when a plurality of mounting substrates are tiled.

BRIEF DESCRIPTION OF DRAWINGS

FIG. 1 is a diagram illustrating an example of a schematic configuration of a display unit according to a first embodiment of the present technology.
FIG. 2 is a diagram illustrating an example of a perspective configuration of the display unit in FIG. 1.
FIG. 3 is a diagram illustrating an example of a perspective configuration of a mounting substrate in FIG. 2.
FIG. 4 is a diagram illustrating an example of a perspective configuration of a unit substrate in FIG. 3.
FIG. 5 is a diagram illustrating an example of a schematic configuration of a circuit in a cell in FIG. 4.
FIG. 6 is a diagram illustrating an example of a specific configuration of the circuit in the cell in FIG. 4.
FIG. 7 is a diagram illustrating an example of a planar configuration of a light-emitting element in FIG. 6.
FIG. 8 is a diagram illustrating an example of a planar configuration of a drive IC in FIG. 6.
FIG. 9 is a diagram illustrating an example of a cross-sectional configuration of the cell in FIG. 4.
FIG. 10 is a diagram illustrating an example of a method of manufacturing the cell in FIG. 9.
FIG. 11 is a diagram illustrating an example of a process following FIG. 10.
FIG. 12 is a diagram illustrating an example of a process following FIG. 11.
FIG. 13 is a diagram illustrating an example of a process following FIG. 12.
FIG. 14 is a diagram illustrating an example of a process following FIG. 13.
FIG. 15 is a diagram illustrating a modification example of a schematic configuration of the circuit in the cell in FIG. 4.
FIG. 16 is a diagram illustrating a modification example of the circuit in FIG. 15.
FIG. 17 is a diagram illustrating an example of a perspective configuration of an illumination unit according to a second embodiment of the present technology.
FIG. 18 is a diagram illustrating an example of a perspective configuration of the illumination unit in FIG. 17.

FIG. 19 is a diagram illustrating an example of a perspective configuration of a light receiver according to a third embodiment of the present technology.

FIG. 20 is a diagram illustrating an example of a perspective configuration of a light-receiving panel in FIG. 19.

FIG. 21 is a diagram illustrating a modification example of a perspective configuration of the display panel in FIG. 1.

FIG. 22 is a diagram illustrating a modification example of a perspective configuration of an illumination panel in FIG. 18.

FIG. 23 is a diagram illustrating a modification example of a perspective configuration of the light-receiving panel in FIG. 20.

EMBODIMENTS FOR CARRYING OUT THE INVENTION

In the following, some embodiments of the present technology are described in detail with reference to the drawings. It is to be noted that description is given in the following order.

1. First Embodiment (Display Unit)
2. Modification Examples (Display Unit)
3. Second Embodiment (Illumination unit)
4. Third Embodiment (Light Receiver)
5. Modification Examples Common to Respective Embodiments

1. First Embodiment

[Configuration]

FIG. 1 illustrates an example of a perspective configuration of a display unit 1 according to a first embodiment of the present technology. The display unit 1 is a so-called LED display that uses LEDs as display pixels. The display unit 1 may include, for example, a display panel module 10 and a controller 20 that controls the display panel module 10 (more specifically, a plurality of cells 12E to be described later) as illustrated in FIG. 1. The display panel module 10 may include, for example, a display panel 12 and circuits (such as a source driver 13 and a gate driver 14) that are provided around the display panel 12. Each of the cells 12E corresponds to a specific example of a "mounting substrate" of the present technology. The controller 20 corresponds to a specific example of a "control circuit" of the present technology.

(Display Panel 12)

The display panel 12 includes a plurality of pixels 11 that are arranged in a matrix in an entire pixel region 12a of the display panel 12. The pixels 11 correspond to a specific example of "pixels" of the present technology. The pixel region 12a corresponds to a region (display region) where an image is displayed on the display panel 1. The controller 20 drives the respective pixels 11 by active matrix driving, which causes the display panel 12 to display an image on the basis of image signals Vsig1 to VsigN in the display region. The image signals Vsig1 to VsigN are phase-developed image signals.

The display panel 12 includes a plurality of gate lines Gate and a plurality of data lines Sig. The gate lines Gate extends along a row direction, and the data lines Sig extend along a column direction. The data lines Sig correspond to a specific example of "signal lines" of the present technology. The gate lines Gate correspond to a specific example of "selection lines" of the present technology. One of the pixels 11 is provided at a corresponding one of intersections between the data lines Sig and the gate lines Gate. Each of the data lines Sig is coupled to an output terminal of the source driver 13. Each of the gate lines Gate is coupled to an output terminal of the gate driver 14.

FIG. 2 illustrates an example of a perspective configuration of the display panel 12. The display panel 12 is a panel configured by stacking the mounting substrate 12A and a counter substrate 12B. A surface of the counter substrate 12B serves as an image display surface, and has a display region in its central portion. For example, the counter substrate 12B may be disposed at a position facing the mounting substrate 12A with a predetermined gap in between. Moreover, the counter substrate 12B may be in contact with a top surface of the mounting substrate 12A. The counter substrate 12B may have, for example, a light-transmissive substrate that allows visible light to pass therethrough, such as a glass substrate, a transparent resin substrate, and a transparent resin film.

(Mounting Substrate 12A)

FIG. 3 illustrates an example of a perspective configuration of the mounting substrate 12A. For example, the mounting substrate 12A may be configured of a plurality of unit substrates 12C that are tiled as illustrated in FIG. 3. FIG. 4 illustrates an example of a perspective configuration of the unit substrate 12C. Each of the unit substrates 12C may include, for example, a plurality of cells 12E that are tiled and a supporting substrate 12D that supports the cells 12E. Each of the unit substrates 12C may further include a control substrate (not illustrated). The control substrate may be electrically coupled to the cells 12E through electrode pads 34 to be described later. The supporting substrate 12D may be configured of, for example, but not limited to, a metal frame or a wiring substrate. In a case in which the supporting substrate 12D is configured of a wiring substrate, it is possible for the supporting substrate 12D to also serve as a control substrate. At this occasion, one or both of the supporting substrate 12D and the control substrate are electrically coupled to the cells 12E (or a wiring substrate 30 to be described later) through the electrode pads 34. The supporting substrate 12D corresponds to a specific example of a "supporting substrate" of the present technology. The foregoing wiring substrate corresponds to a specific example of a "wiring substrate" of the present technology. The electrode pad 34 corresponds to a specific example of an "electrode pad" of the present technology.

(Circuit Configuration of Cell 12E)

FIG. 5 illustrates an example of a schematic configuration of a circuit in the cell 12E. FIG. 5 illustrates a plurality of data lines Sig and a plurality of gate lines Gate that are main wiring lines, a plurality of pixels 11, and a plurality of gate driver ICs 14A. The gate driver ICs 14A corresponds to a specific example of "drivers" of the present technology. Note that the gate driver ICs 14A are described later. FIG. 6 illustrates an example of a specific configuration of the circuit in the cell 12E.

The cell 12E includes the plurality of data lines Sig and the plurality of gate lines Gate in the foregoing pixel region 12a. The data lines Sig extends along the column direction, and the gate lines Gate extends along the row direction. The data lines Sig and the gate lines Gate may be made of copper, for example. The cell 12E may further include the plurality of pixels 11 that are arranged in a matrix in the foregoing pixel region 12a. Each of the pixels 11 includes a light-emitting element 15 and a drive IC 16 that controls light emission of the light-emitting element 15. The light-emitting element 15 corresponds to a specific example of an "optical element" or a "light-emitting element" of the present technology. The drive IC 16 corresponds to a specific example of a "pixel circuit" of the present technology.

The cell 12E may further include, for example, a plurality of sawtooth voltage lines Saw, a plurality of power source lines VDD1 and VDD2, a plurality of reference voltage lines Ref1 and Ref2, and a plurality of ground lines GND in the pixel region 12a. The sawtooth voltage lines Saw may extend along a predetermined direction (more specifically, the row direction), for example. The power source lines VDD1, the power source lines VDD2, the reference voltage lines Ref1, the reference voltage lines Ref2, and the ground lines GND may extend along a predetermined direction (more specifically, the column direction), for example. It is possible to omit one or more of the sawtooth voltage lines Saw, the power source lines VDD1 and VDD2, the reference voltage lines Ref1 and Ref2, and the ground lines GND, depending on a driving mode. The sawtooth voltage lines Saw, the power source lines VDD1 and VDD2, the reference voltage lines Ref1 and Ref2, and the ground lines GND may be made of copper, for example. As used herein, the data lines Sig, the power source lines VDD1, the power source lines VDD2, the reference voltage lines Ref1, the reference voltage lines Ref2, and the ground lines GND are collectively referred to as column wiring lines. Moreover, as used herein, the gate lines Gate and the sawtooth voltage lines Saw are collectively referred to as row wiring lines.

Each of the data lines Sig is a wiring line to which a signal corresponding to an image signal is to be inputted by the source driver 13. The signal corresponding to the image signal may be, for example, a signal for control of light emission luminance of the light-emitting element 15. The plurality of the data lines Sig may be configured of, for example, wiring lines of a number of kinds corresponding to the number of emission colors of the light-emitting element 15. In a case in which the light-emitting element 15 has three emission colors, the plurality of data lines Sig may include, for example, a plurality of data lines SigR, a plurality of data lines SigG, and a plurality of data lines SigB. Each of the data lines SigR is a wiring line to which a signal corresponding to a red image signal is to be inputted by the source drive 13. Each of the data lines SigG is a wiring line to which a signal corresponding to a green image signal is to be inputted by the source driver 13. Each of the data lines SigB is a wiring line to which a signal corresponding to a blue image signal is to be inputted by the source driver 13. At this occasion, the image signals Vsig1 to VsigN may include, for example, a red image signal, a green image signal, and a blue image signal.

The number of emission colors of light-emitting element 15 is not limited to three, and may be four or more. In a case in which the plurality of data lines Sig include the plurality of data line SigR, the plurality of data lines SigG, and the plurality of data lines SigB, one set of the data lines Sig configured of one data line SigR, one data line SigG, and one data line SigR may be assigned to each pixel column, for example. In other words, three of the plurality of data lines Sig may be assigned to each pixel column, for example.

Each of the gate lines Gate is a wiring line to which a signal for selection of the light-emitting element 15 is to be inputted by the gate driver 14. The signal for selection of the light-emitting element 15 may be, for example, a signal to start sampling a signal inputted to the data line Sig and to allow the sampled signal to be inputted to the light-emitting element 15, thereby starting light emission of the light-emitting element 15. One of the plurality of gate lines Gate may be assigned to each pixel row, for example.

Each of the sawtooth voltage lines Saw is a wiring line to which a signal having a sawtooth waveform is to be inputted by the controller 20. The signal having the sawtooth waveform is compared with a sampled signal. For example, the sampled signal is inputted to the light-emitting element 15 only in a period in which a peak value of the signal having the sawtooth waveform is higher than a peak value of the sampled signal. One of the sawtooth voltage lines Saw may be assigned to every two pixel rows, for example.

Each of the power source lines VDD2 is a wiring line to which a drive current to be supplied to the light-emitting element 15 is to be inputted by the controller 20. One of the power source lines VDD2 may be assigned to every two pixel columns, for example. Each of the power source lines VDD1, the reference voltage lines Ref1, the reference voltage lines Ref2, and the ground lines GND is a wiring line to which a fixed voltage is to be inputted by the controller 20. A ground potential is inputted to each of the ground lines GND. One of the power source lines VDD1 may be assigned to every two pixel columns, for example. One of the reference voltage lines Ref1 may be assigned to every two pixel columns, for example. One of the reference voltage lines Ref2 may be assigned to every two pixel columns, for example. One of the ground lines GND may be assigned to every two pixel columns, for example.

FIG. 7 illustrates an example of a planar configuration of the light-emitting element 15. A symbol in a square in FIG. 7 indicates that a terminal adjacent to the symbol is electrically coupled to a terminal adjacent to a symbol identical thereto in FIG. 8 to be described later. The light-emitting element 15 is a chip-like component that emits light of a plurality of colors. In a case in which the number of emission colors of the light-emitting element 15 is three, the light-emitting element 15 may include, for example, a light-emitting element 15R that emits red light, a light-emitting element 15G that emits green light, and a light-emitting element 15B that emits blue light. The light-emitting elements 15R, 15G, and 15B may be covered with a protector 15i made of a resin or any other material, for example.

Each of the light-emitting elements 15R, 15G, and 15B may be an LED chip, for example. Herein, the foregoing LED chip has a micrometer-order chip size, and may have several tens of µm square, for example. The LED chip may include, for example, a semiconductor layer and two electrodes disposed on a common surface (same surface) where the semiconductor layer is disposed. The semiconductor layer may have a stacked configuration in which an active layer is interposed between semiconductor layers of different conductive types. The light-emitting elements 15R, 15G, and 15B may be chips separate from each other, or may form a common single chip.

The light-emitting element 15 may include, for example, six electrode pads 15a to 15f. In the light-emitting element 15G, one of the electrodes is electrically coupled to an electrode pad 16m of the drive IC 16 through the electrode pad 15a and a wiring line 17 (refer to FIGS. 5 and 6), and the other electrode is electrically coupled to the ground line GND through the electrode pad 15b and the wiring line 17. In the light-emitting element 15R, one of the electrodes is electrically coupled to an electrode pad 16o of the drive IC 16 through the electrode pad 15c and the wiring line 17, and the other electrode is electrically coupled to the ground line GND through the electrode pad 15d and the wiring line 17. In the light-emitting element 15B, one of the electrodes is electrically coupled to an electrode pad 16p of the drive IC 16 through the electrode pad 15e and the wiring line 17, and the other electrode is electrically coupled to the ground line GND through the electrode pad 15f and the wiring line 17.

The wiring line 17 may be, for example, a wiring line that electrically couples the pixel 11 to one of the data line Sig, the gate line Gate, the power source line VDD1, the power source line VDD2, the reference voltage line Ref1, the reference voltage line Ref2, the sawtooth voltage line Saw, and the ground line GND. The wiring line 17 may be, for example, a wiring line that electrically couples the light-emitting element 15 to the drive IC 16 in the pixel 11 as well. The wiring line 17 may be formed by sputtering or plating, for example. Some of a plurality of wiring lines 17 directly couple the pixel 11 to any of the foregoing various row wiring lines or the foregoing various column wiring lines. Each of the other wiring lines 17 of the plurality of wiring lines 17 is made up of a plurality of partial wiring lines that are discretely formed. In each of the wiring lines 17 made up of the plurality of partial wiring lines, partial electrodes may be coupled through one or a plurality of relay wiring lines that are formed on a top surface (for example, a wiring layer 32E to be described later) of the wiring substrate 30. The relay wiring line may be made of copper, for example.

FIG. 8 illustrates an example of a planar configuration of the drive IC 16. A wiring line name in a square in FIG. 8 represents the name of a wiring line electrically coupled to a terminal adjacent to this wiring line name. The drive IC 16 controls light emission of the light-emitting element 15. The drive IC 16 may include 14 electrode pads 16a, 16b, 16c, 16d, 16e, 16f, 16g, 16h, 16i, 16k, 16m, 16n, 16o, and 16p.

The electrode pads 16a, 16b, and 16c are respectively electrically coupled to the data lines SigG, SigR, and SigB through the wiring lines 17. The electrode pads 16d and 16e are respectively electrically coupled to the power source lines VDD1 and VDD2 through the wiring lines 17. The electrode pads 16f and 16g are respectively electrically coupled to the reference potential lines Ref1 and Ref2 through the wiring lines 17. The electrode pad 16h is electrically coupled to the ground line GND through the wiring line 17. The electrode pad 16i is electrically coupled to the gate line Gate through the wiring line 17. The electrode pad 16k is electrically coupled to the sawtooth voltage line Saw through the wiring line 17. The electrode pads 16m, 16o, and 16n are electrically coupled to the electrode pads 15a, 15c, and 15e of the light-emitting element 15 through the wiring lines 17. The electrode pad 16p is not coupled to the wiring line 17.

Next, description is given of the source driver 13, the gate driver 14, and the gate driver IC 14C with reference to FIGS. 1, 5, and 6.

(Source Driver 13)

The source driver 13 supplies the respective pixels 11 with analog image signals Vsig1 to VsigN as signal voltages for one horizontal line inputted from the controller 20. More specifically, the source driver 13 supplies the respective pixels 11 configuring one horizontal line selected by the gate driver 14 with the analog image signals Vsig1 to VsigN for one horizontal line through the data lines Sig.

(Gate Driver 14)

The gate driver 14 selects the pixels 11 as driving targets in response to a timing pulse TP inputted from the controller 20. The timing pulse TP may include, for example, a shift signal and a clock signal. More specifically, the gate driver 14 selects, as driving targets, one row of the pixels 11 of the plurality of pixels arranged in a matrix by application of a selection signal to the drive IC 16 through the gate line Gate. Thereafter, these selected pixels 11 perform display of one horizontal line on the basis of the signal voltages supplied from the source driver 13. Thus, the gate driver 14 performs line-sequential scanning in units of one horizontal line in a time-divisional manner to cause the display panel 12 to perform display on the entire pixel region 12a.

(Gate Driver IC 14A)

The gate driver 14 is configured of the plurality of gate driver ICs 14A. One of the plurality of the gate driver ICs 14A is assigned to every plurality of pixel rows. For example, one of the gate driver ICs 14A is assigned to every two pixel rows as illustrated in FIGS. 5 and 6. Accordingly, two gate lines Gate are coupled to each of the gate driver ICs 14A.

Each of the gate driver ICs 14A outputs the selection signal to the gate lines Gate on the basis of the shift signal and the clock signal to control a timing of sampling a data signal (i.e., light emission start timing) in the drive IC 16. At this occasion, each of the drive ICs 16 performs sampling of the data signal inputted through the data line Sig on the basis of the selection signal inputted through the gate lines Gate. When the selection signal is outputted to a second one of the gate lines Gate, each of the gate driver ICs 14A outputs a shift signal to the following gate driver IC 14A in synchronization with an output timing of the selection signal. When each of the gate driver ICs 14A outputs the selection signal to a first one of the gate lines Gate, the gate driver IC 14A continuously outputs the selection signal to the second one of the gate lines Gate. Therefore, each of the gate driver ICs 14A does not output the shift signal at this occasion.

The shift signal and the clock signal are inputted from the controller 20 to the gate driver IC 14A (i.e., a first gate driver IC 14A) assigned to a first pixel row and a second pixel row. In other words, the controller 20 directly outputs the shift signal and the clock signal to the first gate driver IC 14A. Signal exchange between the controller 20 and the first gate driver IC14 is performed through a shift line SFT and a clock line CLK.

In contrast, the shift signal and the clock signal are inputted to second and later gate driver ICs 14A from their respective previous gate driver ICs 14A. In other words, each of the second and later gate driver ICs 14A outputs the shift signal and the clock signal to the following gate driver IC 14A. Note that the clock signal may be inputted to each of the gate driver ICs 14A directly and not through other gate driver ICs 14A. In other words, the controller 20 may directly output the clock signal to each of the gate driver ICs 14A. Signal exchange between the gate driver IC 14A and the following gate driver IC 14A is performed through the foregoing wiring line 17.

Each of the gate driver ICs 14A has a function for two pixel rows in the gate driver 14. Accordingly, a chip size of each of the gate driver ICs 14A is extremely smaller than a chip size of an IC generally used as the gate driver 14, and is sufficiently smaller than a pitch of the pixels 11. Therefore, each of the gate driver ICs 14A is disposed adjacent to the pixel 11 without disturbing arrangement of the pixels 11 in the pixel region 12a. For example, a thickness of each of the gate driver ICs 14A may be substantially equal to or smaller than thicknesses of the light-emitting element 15 and the drive IC 16. The thickness of each of the gate driver ICs 14A may be 20 μm or less, for example.

(Configuration of Cell 12E)

FIG. 9 illustrates an example of a cross-sectional configuration of the cell 12E. FIG. 9 illustrates an example of a cross-sectional configuration of a portion of the cell 12E. In the portion, the light-emitting element 15, the drive IC 16, the data line Sig, and the clock line CLK are formed.

The cell 12E may include, for example, the wiring substrate 30, a fine L/S layer 40, and a plurality of pixels 11. The fine L/S layer 40 is formed in contact with the top surface of the wiring substrate 30, and the pixels 11 are arranged in a matrix on a top surface of the fine L/S layer 40. The wiring substrate 30 has a role as an intermediate substrate in relation to the wiring substrate 12D.

The cell 12E may further include, for example, an embedding layer 44, a light-shielding layer 45, and an insulating layer 50. A surface including the pixels 11 is covered with the embedding layer 44. The light-shielding layer 45 is formed in contact with the embedding layer 44. The insulating layer 50 is formed in contact with a rear surface of the wiring substrate 30. The embedding layer 44 is made of a light-transmissive material that allows visible light to pass therethrough. The light-shielding layer 45 includes a visible-light absorbing material. The insulating layer 50 may be made of an ultraviolet curable resin or a thermosetting resin.

The light-shielding layer 45 has an opening 45A at a position facing each of the light-emitting elements 15. Light emitted from each of the light-emitting elements 15 is outputted to outside through each of the openings 45A. The insulating layer 50 has an opening 50A at a position facing each of the electrode pads 34 serving as an external connection terminal of the cell 12E. Accordingly, each of the electrode pads 34 is exposed on a rear surface of the cell 12E (the wiring substrate 30) through the opening 50A. The electrode pad 34 and the wiring substrate 12D may be electrically coupled to each other through, for example, a metal bump or a solder bump provided in the opening 50A.

(Wiring Substrate 30)

The wiring substrate 30 is a multilayer substrate utilizing via-bonding. The wiring substrate 30 includes a plurality of electrode pads 34 serving as external connection terminals on the rear surface of the wiring substrate 30. One or more of the plurality of electrode pads 34 are provided for at least each of the gate driver ICs 14A, and one or more of the electrode pads 34 may be provided for each of the gate driver ICs 14A, the data lines Sig, the power source lines VDD1, the reference voltage lines Ref1, the reference voltage lines Ref2, and the sawtooth voltage lines Saw.

The wiring substrate 30 electrically couples the plurality of wiring lines 17 routed in the fine L/S layer 40 to the plurality of electrode pads 34. The wiring substrate 30 includes a plurality of through wiring lines 17 that electrically couple the plurality of wiring lines 17 to the plurality of electrode pads 34. Each of the through wiring lines 17 is a wiring line that penetrates the wiring substrate 30 in a thickness direction. Some of the through wiring lines 17 each include the data line Sig and a plurality of vias. The data line Sig extends along the column direction in the wiring substrate 30. The plurality of vias penetrate one or more of layers in the wiring substrate 30. Some of the through wiring lines 17 each include the clock line CLK and a plurality of vias. The clock line CLK extends in the column direction in the wiring substrate 30. The plurality of vias penetrate one or more of the layers in the wiring substrate 30.

Some of the through wiring lines 17 each include the power source line VDD1 and a plurality of vias. The power source line VDD1 extends along the column direction in the wiring substrate 30. The plurality of vias penetrate one or more of the layers in the wiring substrate 30. Some of the through wiring lines 17 each include the reference voltage line Ref1 and a plurality of vias. The reference voltage line Ref1 extends along the column direction in the wiring substrate 30. The plurality of vias penetrate one or more of the layers in the wiring substrate 30. Some of the through wiring lines 17 each include the reference voltage line Ref2 and a plurality of vias. The reference voltage line Ref2 extends along the column direction in the wiring substrate 30. The plurality of vias penetrate one or more of the layers in the wiring substrate 30. Some of the through wiring lines 17 include the sawtooth voltage line Saw and a plurality of vias. The sawtooth voltage line Saw extends along the column direction in the wiring substrate 30. The plurality of vias penetrate one or more of the layers in the wiring substrate 30.

Incidentally, as described above, for example, the plurality of pixels 11 are arranged at equal intervals along the row direction and the column direction as illustrated in FIG. 5. At this occasion, a pitch of the pixels 11 may be preferably equal not only in each of the cells 12E but also in two adjacent cells 12E. In each of the cells 12E, a plurality of electrode pads 34 are provided as external connection terminals of each of the cells 12E on the rear surface of the cell 12E. This makes it possible to omit or minimize a frame region that is not usable for arrangement of the pixels 11, for example, in a case in which an external connection terminal is provided on an outer edge of a top surface of a mounting surface. Accordingly, in a case in which such a frame region is omitted from each of the cells 12E, or in a case in which such a frame region is minimized in each of the cells 12E, it is possible for the pitch of the pixels 11 to be equal even in two adjacent cells 12E.

The wiring substrate 30 may be, for example, a build-up substrate including a core substrate 31, a build-up layer 32, and a build-up layer 33. The build-up layer 32 is formed in contact with a top surface of the core substrate 31. The build-up layer 33 is formed in contact with a rear surface of the core substrate 31.

The core substrate 31 ensures rigidity of the cell 12E, and may be a glass epoxy substrate, for example. The build-up layer 32 includes one or more wiring layers. The build-up layer 32 may include, for example, a wiring layer 32A, an insulating layer 32B, a wiring layer 32C, an insulating layer 32D, and a wiring layer 32E in this order from the top surface of the core substrate 31, as illustrated in FIG. 9. The build-up layer 33 includes one or more wiring layers. The build-up layer 33 may include, for example, a wiring layer 33A, an insulating layer 33B, a wiring layer 33C, an insulating layer 33D, and an insulating layer 33E in this order from the rear surface of the core substrate 31, as illustrated in FIG. 9. The wiring layers 32A, 32C, 32E, 33A, 33C, and 33E may be made of copper, for example. The insulating layers 32B, 32D, 33B, and 33D may be made of an ultraviolet curable resin or a thermosetting resin.

Each of the data lines Sig may be formed in the wiring layer 32C, for example. Each of the gate lines Gate are formed in a layer different from the data line Sig, and may be formed in the wiring layer 32E that is a wiring layer on the top surface of the wiring substrate 30, for example. Each of the clock lines CLK and the shift lines SFT may be formed in the same layer as the gate line Gate, and may be formed in the wiring layer 32E. Each of the electrode pads 34 is formed in the build-up layer 33, and may be formed in the same layer as the wiring layer 33E, for example. The foregoing relay wiring line may be formed in the wiring layer 32E, for example.

(Fine L/S Layer 40)

The fine L/S layer 40 includes a wiring layer 42 and an insulating layer 41. The insulating layer 41 is provided between the wiring layer 42 (each of the wiring lines 17) and the top surface of the wiring substrate 30. The insulating layer 41 is in contact with the wiring layer 42 (each of the wiring lines 17) and the top surface of the wiring substrate 30. The insulating layer 41 may has an opening 41A at a position facing a top surface of each of the gate line Gate, the clock line CLK, and the shift line STF, for example. For example, a portion of each of the gate line Gate, the clock line CLK, and the shift line STF may be exposed on a bottom surface of the opening 41A. The insulating layer 41 may be made of VPA, for example. VPA is generally used as a resist. For example, VPA manufactured from Nippon Steel Chemical Co., Ltd. has been introduced on the market. In a case in which the insulating layer 41 is made of VPA, for example, selective light-exposure and development of VPA may make it possible to form the opening 41 in the VPA.

The wiring layer 42 (each of the wiring lines 17) may include, for example, a seed layer 42A and a plating layer 42B. The seed layer 42A is in contact with the top surface of the wiring substrate 30 including the bottom surfaces and side surfaces of the openings 41A. The plating layer 42B is in contact with a top surface of the seed layer 42A. The seed layer 42A serves as a plating growth surface when the plating layer 42B is formed by plating in a manufacturing process. The seed layer 42A is in contact with the bottom surfaces of the openings 41A, and may be electrically coupled to the gate line Gate, the clock line CLK, and the shift line STF, for example. The seed layer 42A may be made of copper, for example. The plating layer 42B is formed by a plating process using the seed layer 42 as the plating growth surface in the manufacturing process. Note that the wiring layer 42 (each of the wiring lines 17) may be a layer formed by sputtering, for example.

As described above, the wiring layer 42 (each of the wiring lines 16) is formed in contact with the top surface of the insulating layer 41. In contrast, electrodes of the pixels 11 are formed in contact with the top surface of the seed layer 42A. Therefore, the light-emitting elements 15 and the drive ICs 16 are formed on the same surface (the top surface of the seed layer 42A). To be exact, the light-emitting elements 15 and the drive ICs 16 are formed on a different surface from a surface (the top surface of the insulating layer 41) where the wiring layer 42 (each of the wiring lines 16) is formed. However, in terms of mounting of the pixels 11, a surface including the top surface of the insulating layer 41 and the top surface of the seed layer 42A serves as a mounting surface 41S. Accordingly, the wiring layer 42 (each of the wiring lines 16) is formed on the mounting surface 41S for the pixels 11, and is formed in a surface substantially common to the pixels 11.

The wiring layer 42 (each of the wiring lines 17) may be bonded to, for example, the gate driver ICs 14A and members exposed in the openings 41A (for example, the gate line Gate, the clock line CLK, and the shift line STF) by plating. When the wiring layer 42 (each of the wiring lines 17) is formed by plating, bonding between the wiring layer 42 (each of the wiring lines 17), and the gate driver ICs 14A and the foregoing members exposed in the opening 41A may be performed together in a process of forming the wiring layer 42 (each of the wiring lines 17). The wiring layer 42 (each of the wiring line 17) may be bonded to, for example, the pixels 11 (the light-emitting elements 15 and the drive ICs 16) by plating. When the wiring layer 42 (each of the wiring lines 17) is formed by plating, bonding between the wiring layer 42 (each of the wiring lines 17) and the pixels 11 may be performed together in the process of forming the wiring layer 42 (each of the wiring lines 17).

An L/S (line and space) of the fine L/S layer 40 is smaller than an L/S of the wiring substrate 30. The L/S indicates the narrowest wiring pitch in a plane. The L/S of the fine L/S layer 40 is smaller than those of the plurality of signal lines Sig, the plurality of gate lines Gate, the plurality of voltage lines VDD1, the plurality of reference voltage lines Ref1, the plurality of reference voltage lines Ref2, and the sawtooth voltage lines Saw. The L/S of the fine L/S layer 40 may be about 25 µm, for example. In contrast, the L/S of the wiring substrate 30 may be about 75 µm, for example.

[Manufacturing Method]

Next, description is given of an example of a method of manufacturing the cell 12E with reference to FIGS. 10 to 14. FIGS. 10 to 14 illustrate an example of a procedure of manufacturing the cell 12E in order of processes.

First, the wiring substrate 30 is prepared. Next, the insulating layer 41 is formed on the top surface of the wiring substrate 30, and thereafter, the openings 41A are formed in the insulating layer 41 by a predetermined method (see FIG. 10). Subsequently, the seed layer 42A is formed on the top surface of the wiring substrate 30 including the bottom surfaces and the side surfaces of the openings 41A (see FIG. 11).

Next, a fixing layer 43A that temporarily fixes the light-emitting elements 15, the drive ICs 16, and the gate driver ICs 14A (hereinafter referred to as "the light-emitting elements 15 and the other components") is formed by a process such as coating an entire surface with an insulating glue (refer to FIG. 12). A layer of an adhesive as typified by a silicone-based adhesive and an acrylic adhesive may be formed as the fixing layer 43A instead of the glue. Subsequently, the light-emitting elements 15 and the other components are temporarily fixed by the fixing layer 43A (see FIG. 12). At this occasion, the electrode pads of the light-emitting elements 15 and the other components are disposed close enough to be connectable to a metal body (the plating layer 42B) that is to be grown in a plating process to be described later.

Next, the fixing layer 43A excluding portions that temporality fixes the light-emitting elements 15 and the other components (portions present on the bottom surfaces of the light-emitting element 15 and the other components) is removed. As a result, the fixing layer 43A remains only on the bottom surfaces of the light-emitting elements 15 and the other components (see FIG. 13). In FIG. 13, the remaining fixing layer 43A is illustrated as a fixing layer 43. In removing the fixing layer 43A, it may be possible to perform, for example, dry etching or organic solvent immersion. Note that the insulating glue may be applied beforehand only to positions where the light-emitting elements 15 and the other components are to be temporarily fixed.

Thereafter, the plating process is performed with use of the seed layer 42A as the plating growth surface to form the plating layer 42B on the top surface of the seed layer 42A (see FIG. 14). Thus, the wiring layer 42 (each of the wiring lines 17) is formed. At this occasion, bonding between the wiring layer 42 (each of the wiring lines 17), and the light-emitting element 15 and the other components is performed together in the process of forming the wiring layer 42 (each of the wiring lines 17). Moreover, bonding between the wiring layer 42 (each of the wiring lines 17) and the foregoing members exposed in the openings 41A is performed together in the process of forming the wiring layer 42 (each of the wiring lines 17). After that, the light-emitting elements 15 and the other components are embedded in the embedding layer 43, and thereafter, the light-shielding layer 45 is formed (refer to FIG. 9). Thus, the cell 12E is manufactured.

[Workings and Effects]

Next, description is given of workings and effects of the display unit 1. In the present embodiment, the plurality of gate driver ICs 14A are disposed in the pixel region 12a, and one of the gate driver ICs 14A is assigned to every plurality of pixel rows. Accordingly, it is not necessary to provide the plurality of gate driver ICs 14A on a top surface end of the cell 12E and it is not necessary to provide a connection terminal of a FPC including the plurality of gate driver ICs 14A on the top surface end of the cell 12E. As a result, it is possible to make a seam in a displayed image more inconspicuous when the plurality of unit substrates 12C are tiled.

2. Modification Examples

Modification Example 1

In the foregoing embodiment, one set of the data lines Sig is assigned to each pixel column. In other words, three of the plurality of data lines Sig are assigned to each pixel column. Alternatively, the foregoing set of the data lines Sig may be replaced with a single data line Sig, depending on a driving mode.

Modification Example 2

In the foregoing embodiment, one of the plurality of gate driver ICs 14A is assigned to every plurality of pixel rows. Alternatively, one of the plurality of gate driver ICs 14A may be assigned to each pixel row.

Modification Example 3

Moreover, in the foregoing embodiment, one set of the data lines Sig may be assigned to every plurality of pixel columns. In other words, two or more of the plurality of the data lines Sig may be assigned to every plurality of pixel columns. For example, one set of the data lines Sig may be assigned to every two pixel columns as illustrated in FIG. 15. In other words, three of the plurality of the data lines Sig may be assigned to every two pixel columns. Note that even in the present modification example, the foregoing one set of the data lines Sig may be replaced with a single data line Sig, depending on a driving mode. In this case, one of the plurality of the data lines Sig is assigned to every plurality of pixel columns.

At this occasion, when pixel rows are separated into groups of a number of pixel rows equal to the number of pixels sharing one or more of the data lines Sig in one pixel row, a number of the gate lines Gate equal to the square of the number of pixels sharing the one or more of the data lines Sig in one pixel row are assigned to each of the groups. For example, when the pixel rows are separated into groups of two pixel rows, the square of two, i.e. four of the plurality of the gate lines Gate are assigned to each of the groups, as illustrated in FIG. 15.

One of the gate lines Gate assigned to each of the foregoing groups is assigned to each of the pixels 11 to which the shared one or more data lines Sig are assigned in each pixel row. For example, one of two gate lines Gate assigned to each of the foregoing groups may be assigned to pixels 11 in odd-numbered columns, and the other one may be assigned to pixels 11 in even-numbered columns, as illustrated in FIG. 15.

A number of the gate driver ICs 14A equal to the number of pixel rows included in each of the foregoing groups is assigned. For example, two of the plurality of gate driver ICs 14A may be assigned to each of the foregoing groups, as illustrated in FIG. 15.

In the present modification example, the plurality of gate driver ICs 14A are disposed in the pixel region 12a. Moreover, while the data line(s) Sig is shared by two or more of the pixels 11 included in one pixel row, a number of the gate driver ICs 14A equal to the number of the pixel rows included in each of the foregoing groups are assigned to each of the foregoing groups. Accordingly, when the pixels 11 have the same pitch as that in the foregoing embodiment, it is possible to provide a larger space region in the pixel region 12a than that in the foregoing embodiment. Hence, even in a case in which the pitch of the pixels 11 is narrower than the pitch of the pixels 11 in the foregoing embodiment, it is possible to dispose the respective gate driver ICs 14 in the pixel region 12a. This makes it possible to narrow the pitch of the pixels 11 and make a seam in a displayed image more inconspicuous when the plurality of cells 12E or the plurality of unit substrates 12C are tiled.

Modification Example 4

Further, in the foregoing modification example 3, two gate lines Gate are coupled to each of the gate driver ICs 14A; however, three or more gate lines Gate may be coupled to each of the gate driver ICs 14A. For example, four gate lines Gate may be coupled to each of the gate driver ICs 14A as illustrated in FIG. 16. In this case, each of the gate driver ICs 14A outputs the shift signal to the following gate driver IC 14C in synchronization with an output timing of the selection signal only when the selection signal is outputted to the last one of the four gate lines Gate. When each of the gate driver ICs 14A outputs the selection signal to the gate lines Gate excluding the last gate line Gate, each of the gate driver ICs 14A continues to output the selection signal to the following gate line Gate. Accordingly, each of the gate driver ICs 14A does not output the shift signal at this occasion.

It is possible to couple three or more gate lines Gate to each of the gate driver ICs 14A, which makes it possible to assign one of the plurality of gate driver ICs 14A to each of the foregoing groups. For example, in a case in which it is possible to couple, to each of the gate driver ICs 14A, a number of the gate lines Gate equal to the number of pixel rows included in each of the foregoing groups, one of the plurality of the gate driver ICs 14A is assigned to each of the foregoing groups. For example, in a case in which it is possible to couple each of the gate driver ICs 14A to four gate lines Gate, the plurality of gate lines Gate are separated into groups of four, and one of the gate driver ICs 14A is assigned to each of the foregoing groups, as illustrated in FIG. 16.

Even in the present modification example, as with the foregoing modification example 3, it is possible to narrow the pitch of the pixels 11 and make a seam in a displayed image more inconspicuous when the plurality of cells 12E or the plurality of unit substrates 12C are tiled.

Modification Example 5

In the foregoing embodiment, the light-emitting element 15 and the drive IC 16 may be integrally formed to configure the pixel 11.

Modification Example 6

Moreover, in the foregoing embodiment and the modification examples 1 to 6, the light-emitting elements 15 may have a single emission color. In this case, the cell 12E may include, for example, a color filter for a plurality of colors in the opening 45A.

3. Second Embodiment

FIG. 17 illustrates an example of a schematic configuration of an illumination unit 2 according to a second embodiment of the present technology. The illumination unit 2 corresponds to the display unit 1 according to any of the foregoing first embodiment and the modification examples thereof (the modification examples 1 to 6), except that a signal to be inputted to the data line Sig does not change momently like the image signal, but has a fixed value corresponding to brightness of illumination light. For example, the illumination unit 2 may include an illumination panel module 60 and a controller 70 as illustrated in FIG. 17. The controller controls the illumination panel module 60. The illumination panel module 60 may include, for example, an illumination panel 62 and circuits (such as the source driver 13 and the gate driver 14). The circuits are provided around the illumination panel 62.

(Illumination Panel 62)

The illumination panel 62 includes a plurality of pixels 61 arranged in a matrix in an entire pixel region of the illumination panel 62. The pixel region corresponds to a region (a light emission region) where illumination light is emitted in the illumination panel 62. The controller 70 drives the respective pixels 61 by active matrix driving, which causes the illumination panel 62 to emit illumination light on the basis of a signal Vsig having a fixed value corresponding to brightness of illumination light. The illumination panel 62 includes a plurality of gate lines Gate and a plurality of data lines Sig. The gate lines Gate extend along the row direction, and the data lines Sig extend along the column direction. One of the pixels 61 is provided at a corresponding one of intersections between the data lines Sig and the gate lines Gate.

FIG. 18 illustrates an example of a perspective configuration of the illumination panel 62. The illumination panel 62 is a panel configured by stacking a mounting substrate 62A and a counter substrate 62B. A surface of the counter substrate 62B serves as a light emission surface. For example, the counter substrate 62B may be disposed at a position facing the mounting substrate 62A with a predetermined gap in between. Moreover, the counter substrate 62B may be in contact with a top surface of the mounting substrate 62A. The counter substrate 62B may have, for example, a light-transmissive substrate that allows visible light to pass therethrough, such as a glass substrate, a transparent resin substrate, and a transparent resin film.

For example, the mounting substrate 62A may be configured of a plurality of unit substrates that are tiled as illustrated in FIG. 2. Each of the unit substrates may include, for example, a plurality of cells that are tiled and a supporting substrate that supports the respective cells. Each of the unit substrates may further include a control substrate (not illustrated). The control substrate may be electrically coupled to the cells through the electrode pads 34. The foregoing supporting substrate may be configured of, for example, but not limited to, a metal frame or a wiring substrate. In a case in which the supporting substrate is configured of a wiring substrate, it is possible for the supporting substrate to also serve as a control substrate. In each of the cells, wiring lines that are unnecessary for driving of the pixels 61 in a case in which a signal to be inputted to the data line Sig has a fixed value may be omitted as appropriate in FIGS. 5, 6, 9, 15, and 16, for example.

[Workings and Effects]

Next, description is given of workings and effects of the illumination unit 2. In the present embodiment, as with the display unit 1 according to any of the foregoing first embodiment and the modification examples thereof, the plurality of gate drivers ICs 14A are disposed in the pixel region (the light emission region), and are assigned according to a predetermined rule. Accordingly, it is not necessary to provide the plurality of gate driver ICs 14A on a top surface end of the mounting substrate, and it is not necessary to provide a connection terminal of an FPC including the plurality of gate driver ICs 14A on the top surface end of the mounting substrate. As a result, it is possible to make a seam in illumination light more inconspicuous when a plurality of mounting substrates are tiled.

4. Third Embodiment

FIG. 19 illustrates an example of a schematic configuration of a light receiver 3 according to a third embodiment of the present technology. The light receiver 3 corresponds to the display unit 1 according to any of the foregoing first embodiment and the modification examples thereof (the modification examples 1 to 6), except that a signal to be inputted to the data line Sig does not vary momently like the image signal, but has a fixed value. Moreover, the light receiver 3 corresponds to the display unit 1 according to the foregoing first embodiment and modification examples thereof (the modification examples 1 to 4), except that light-receiving elements are provided in place of the pixels 11.

The light receiver 3 may include, for example, a light-receiving panel module 80 and a controller 90 as illustrated in FIG. 19. The controller 90 controls the light-receiving panel module 80. The light-receiving panel module 80 may include, for example, a light-receiving panel 82 and circuits (such as a readout circuit 83 and the gate driver 14). The circuits are provided around the light-receiving panel 82.

(Light-Receiving Panel 82)

The light-receiving panel 82 includes a plurality of pixels 81 arranged in a matrix in an entire pixel region of the light-receiving panel 82. The pixel region corresponds to a region (a light entry region) where outside light enters in the light-receiving panel 82. The controller 90 drives the respective pixels 81 by active matrix driving, which causes the light-receiving panel 82 to detect a signal change on the basis of entry of outside light with use of the readout circuit 83 in a state in which a fixed signal Vsig is inputted from the readout circuit 83. The light-receiving panel 82 includes a plurality of gate lines Gate and a plurality of data lines Sig. The gate lines Gate extend along the row direction, and the data lines Sig extend along the column direction. One of the pixels 81 is provided at a corresponding one of intersections between the data lines Sig and the gate lines Gate.

FIG. 20 illustrates an example of a perspective configuration of the light-receiving panel 82. The light-receiving panel 82 is a panel configured by stacking a mounting substrate 82A and a counter substrate 82B. A surface of the counter substrate 82B serves as a light entry surface. For example, the counter substrate 82B may be disposed at a position facing the mounting substrate 82A with a predetermined gap in between. Moreover, the counter substrate 82B may be in contact with a top surface of the mounting substrate 82A. The counter substrate 82B may have, for example, a light-transmissive substrate that allows visible light to pass therethrough, such as a glass substrate, a transparent resin substrate, and a transparent resin film.

For example, the mounting substrate 82A may be configured of a plurality of unit substrates that are tiled as illustrated in FIG. 2. Each of the unit substrates may include, for example, a plurality of cells that are tiled and a supporting substrate that supports the respective cells. Each of the unit substrates may further include a control substrate (not illustrated). The control substrate may be electrically coupled to the cells through the electrode pads 34. The foregoing supporting substrate may be configured of, for example, but not limited to, a metal frame or a wiring substrate. In a case in which the supporting substrate is configured of a wiring substrate, it is possible for the supporting substrate to also serve as a control substrate. In each of the cells, wiring lines that are unnecessary for driving of the pixels 81 in a case in which a signal to be inputted to the data line Sig has a fixed value are omitted as appropriate in FIGS. 5, 6, 9, 15, and 16, for example.

[Workings and Effects]

Next, description is given of workings and effects of the light receiver 3. In the present embodiment, as with the display unit according to any of the foregoing first embodiment and the modification examples thereof, the plurality of gate drivers ICs 14A are disposed in the pixel region (the light entry region), and are assigned according to a predetermined rule. Accordingly, it is not necessary to provide the plurality of gate driver ICs 14A on a top surface end of the mounting substrate, and it is not necessary to provide a connection terminal of an FPC including the plurality of gate driver ICs 14A on the top surface end of the mounting substrate. As a result, it is possible to make a seam in a light-received image more inconspicuous when a plurality of mounting substrates are tiled.

5. Modification Example Common to Respective Embodiments

In the foregoing respective embodiments and the modification examples thereof, the light-shielding layer 45 may be disposed on a rear surface of any of the counter substrates 12B, 62B, and 82B (a surface facing any of the mounting substrates 12A, 62A, and 82A).

In the foregoing respective embodiments and the modification examples thereof, for example, the counter substrates 12B, 62B, and 82B may be omitted as illustrated in FIGS. 21 to 23. Moreover, in the foregoing respective embodiments and the modification examples thereof, one counter substrate 12B, one counter substrate 62B, or one counter substrate 82B may be provided for each of the unit substrates 12C or each of the cells 12E.

In the foregoing respective embodiments and the modification examples thereof, the light-shielding layer 45 may be omitted.

Further, in the foregoing respective embodiments and the modification examples thereof, the pixels 11, 61, or 81 are bonded to the wiring layer 42 (each of the wiring lines 17) by plating. Alternatively, for example, the pixels 11, 61, or 81 may be bonded to the wiring layer 42 (each of the wiring lines 17) by soldering. For example, solder bumps may be provided on the electrode pads of the pixels 11, 61, or 81, and thereafter, the pixels 11, 61, or 81 may be disposed on the wiring lines 17. Thereafter, a reflow may be performed. This makes it possible to bond the pixels 11, 61, or 81 to the wiring lines 17 by soldering.

Moreover, the present technology may have any of the following configurations.

(1) A mounting substrate including:
a wiring substrate;
a plurality of pixels arranged in a matrix in a pixel region of the wiring substrate; and
a plurality of drivers that are disposed in the pixel region and select the plurality of pixels in units of two or more pixels,
wherein each of the pixels includes an optical element and a pixel circuit, the optical element that emits or receives light, and the pixel circuit that controls light emission or light reception of the optical element, and
one or more of the plurality of drivers are assigned to each pixel row or every plurality of pixel rows.

(2) The mounting substrate according to (1), wherein
the wiring substrate includes a plurality of selection lines extending along a row direction and a plurality of signal lines extending along a column direction,
each of the pixel circuits performs sampling of a data signal to be inputted through the signal line on the basis of a selection signal to be inputted through the selection line, and
each of the drivers outputs the selection signal to the selection lines on the basis of a shift signal and a clock signal to control a timing of sampling of the data signal in the pixel circuit and to output the shift signal to the following driver in synchronization with an output timing of the selection signal.

(3) The mounting substrate according to (1) or (2), wherein
the wiring substrate includes a plurality of electrode pads that are electrically coupled to the drivers and are exposed on a rear surface of the wiring substrate, one or more of the electrode pads being provided for each of the drivers, and
the clock signal is inputted from outside through one or more of the electrode pads.

(4) The mounting substrate according to any one of (1) to (3), wherein
one or more of the signal lines are assigned to each pixel column,
one of the selection lines is assigned to each pixel row, and
one of the drivers is assigned to each pixel row.

(5) The mounting substrate according to any one of (1) to (3), wherein
one or more of the signal lines are assigned to every plurality of pixel columns,
when pixel rows are separated into groups of a number of pixel rows equal to the number of pixels sharing the one or more signal lines in one pixel row, a number of the selection lines equal to the square of the number of pixels sharing the two or more the signal lines in one pixel row are assigned to each of the groups,
one of the selection lines assigned to each of the groups is assigned to each of the pixels to which the shared two or more signal lines are assigned in each pixel row, and
one of the plurality of drivers or a number of the plurality of drivers equal to the number of pixel rows included in each of the groups are assigned to each of the groups.

(6) An electronic apparatus including:
a plurality of mounting substrates; and
a control circuit that controls the plurality of mounting substrates,
each of the mounting substrates including:
a wiring substrate,
a plurality of pixels arranged in a matrix in a pixel region of the wiring substrate, and a plurality of drivers that are disposed in the pixel region and select the plurality of pixels in units of two or more pixels, wherein each of the pixels includes an optical element and a pixel circuit, the optical element that emits or receives light, and the pixel circuit that controls light emission or light reception of the optical element, and one or more of the plurality of drivers are assigned to each pixel row or every plurality of pixel rows.

(7) The electronic apparatus according to (6), further including:

a supporting substrate that supports the plurality of mounting substrates; and a control substrate that controls the plurality of mounting substrates, wherein the plurality of mounting substrates are tiled on the supporting substrate, each of the wiring substrates includes a plurality of electrode pads that are electrically coupled to the drivers and are exposed on a rear surface of the wiring substrate, one or more of the electrode pads being provided for each of the drivers, and one or both of the supporting substrate and the control substrate are electrically coupled to the wiring substrates through the electrode pads.

This application claims the benefit of Japanese Priority Patent Application No. JP 2014-074842 filed with the Japan patent office on Mar. 31, 2014, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A mounting substrate comprising:
a wiring substrate;
a plurality of pixels arranged in a matrix in a pixel region of the wiring substrate; and
a plurality of drivers that are disposed between pixels of the plurality of pixels in the pixel region and select the plurality of pixels in units of two or more pixels,
wherein each of the pixels includes an optical element and a pixel circuit, wherein the optical element emits or receives light, and the pixel circuit controls light emission or light reception of the optical element,
wherein each of the plurality of drivers is assigned to two or more pixel rows, and
wherein the optical elements, the pixel circuits and the drivers are mounted directly on a same surface of a layer of the mounting substrate.

2. The mounting substrate according to claim 1, wherein the wiring substrate includes a plurality of selection lines extending along a row direction and a plurality of signal lines extending along a column direction,
each of the pixel circuits performs sampling of a data signal inputted through the signal line on the basis of a selection signal inputted through the selection line, and
each of the drivers outputs the selection signal to the selection lines on the basis of a shift signal and a clock signal to control a timing of sampling of the data signal in the pixel circuit and to output the shift signal to the following driver in synchronization with an output timing of the selection signal.

3. The mounting substrate according to claim 2, wherein the wiring substrate includes a plurality of electrode pads that are electrically coupled to the drivers and are exposed on a rear surface of the wiring substrate, one or more of the electrode pads being provided for each of the drivers, and
the clock signal is inputted through one or more of the electrode pads.

4. The mounting substrate according to claim 3, wherein one or more of the signal lines are assigned to each pixel column,
one of the selection lines is assigned to each pixel row, and
one of the drivers is assigned to each pixel row.

5. The mounting substrate according to claim 3, wherein one or more of the signal lines are assigned to two or more pixel columns.

6. The mounting substrate according to claim 5, wherein first selection lines are assigned to odd-numbered pixel columns and second selection lines are assigned to even-numbered columns.

7. The mounting substrate according to claim 5, wherein each of the plurality of drivers is assigned to two or more columns.

8. An electronic apparatus comprising:
a plurality of mounting substrates; and
a control circuit that controls the plurality of mounting substrates,
each of the mounting substrates including:
a wiring substrate,
a plurality of pixels arranged in a matrix in a pixel region of the wiring substrate, and
a plurality of drivers that are disposed between pixels of the plurality of pixels in the pixel region and select the plurality of pixels in units of two or more pixels,
wherein each of the pixels includes an optical element and a pixel circuit, wherein the optical element emits or receives light, and the pixel circuit controls light emission or light reception of the optical element,
wherein each of the plurality of drivers is assigned to two or more pixel rows, and
wherein the optical elements, the pixel circuits and the drivers are mounted directly on a same surface of a layer of the mounting substrate.

9. The electronic apparatus according to claim 8, further comprising:
a supporting substrate that supports the plurality of mounting substrates; and
a control substrate,
wherein the plurality of mounting substrates are tiled on the supporting substrate,
each of the wiring substrates includes a plurality of electrode pads that are electrically coupled to the drivers and are exposed on a rear surface of the wiring substrate, one or more of the electrode pads being provided for each of the drivers, and
one or both of the supporting substrate and the control substrate are electrically coupled to the wiring substrates through the electrode pads.

* * * * *